United States Patent
Dun

(10) Patent No.: US 10,168,977 B2
(45) Date of Patent: Jan. 1, 2019

(54) BIDIRECTIONAL SCANNING UNIT, DRIVING METHOD AND GATE DRIVING CIRCUIT

(71) Applicants: SHANGHAI AVIC OPTO ELECTRONICS CO., LTD, Shanghai (CN); TIANMA MICRO-ELECTRONICS CO., LTD., Shenzhen (CN)

(72) Inventor: Dongliang Dun, Shanghai (CN)

(73) Assignees: SHANGHAI AVIC OPTO ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 237 days.

(21) Appl. No.: 15/352,578

(22) Filed: Nov. 16, 2016

(65) Prior Publication Data
US 2017/0061862 A1 Mar. 2, 2017

(30) Foreign Application Priority Data
Jul. 29, 2016 (CN) .......................... 2016 1 0617299

(51) Int. Cl.
*G11C 19/00* (2006.01)
*G06F 3/14* (2006.01)
*G11C 19/28* (2006.01)

(52) U.S. Cl.
CPC ............ *G06F 3/1446* (2013.01); *G11C 19/28* (2013.01); *G09G 2300/026* (2013.01); *G09G 2310/0267* (2013.01); *G09G 2310/0283* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| 9,106,209 B2 * | 8/2015 | Kang | G09G 3/3677 |
| 2009/0167668 A1 * | 7/2009 | Kim | G09G 3/3677 345/100 |
| 2009/0256794 A1 * | 10/2009 | Jang | G11C 19/28 345/100 |

(Continued)

FOREIGN PATENT DOCUMENTS

| CN | 104347039 A | 2/2015 |
| CN | 104537991 A | 4/2015 |

*Primary Examiner* — Tuan T Lam
(74) *Attorney, Agent, or Firm* — Kilpatrick Townsend & Stockton LLP

(57) ABSTRACT

A bidirectional scanning unit, a driving method and a gate driving circuit are provided. The bidirectional scanning unit includes a first-stage sub unit and a second-stage sub unit, the bidirectional scanning unit can output a scanning signal stage by stage in a direction from the first-stage sub unit to the second-stage sub unit, and can also output a scanning signal stage by stage in a direction from the second-stage sub unit to the first-stage sub unit. The first-stage sub unit coordinates with the second-stage sub unit in a scanning process, when one of the first-stage sub unit and the second-stage sub unit outputs the scanning signal, the other of the first-stage sub unit and the second-stage sub unit does not output the scanning signal.

20 Claims, 7 Drawing Sheets

(56) References Cited

U.S. PATENT DOCUMENTS

| | | | | |
|---|---|---|---|---|
| 2011/0002438 A1* | 1/2011 | Kim | ................. | G11C 19/28 |
| | | | | 377/67 |
| 2011/0273417 A1* | 11/2011 | Shin | ................. | G09G 3/20 |
| | | | | 345/211 |
| 2013/0148775 A1* | 6/2013 | Shin | ................. | G11C 19/28 |
| | | | | 377/69 |
| 2016/0351156 A1* | 12/2016 | Wu | ................. | G11C 19/28 |
| 2017/0193950 A1* | 7/2017 | Kim | ................. | G09G 3/3677 |

* cited by examiner

BIDIRECTIONAL SCANNING UNIT, DRIVING METHOD AND GATE DRIVING CIRCUIT

CROSS REFERENCE OF RELATED APPLICATION

The present application claims the priority to Chinese Patent Application No. 201610617299.4, titled "BIDIRECTIONAL SCANNING UNIT, DRIVING METHOD AND GATE DRIVING CIRCUIT", filed on Jul. 29, 2016 with the State Intellectual Property Office of the PRC, which is incorporated herein by reference in its entirety.

FIELD

The present disclosure relates to the field of display technology, and particularly to a bidirectional scanning unit, a driving method and a gate driving circuit.

BACKGROUND

With the development of electronic technology, a display device such as a TV, a phone, a computer, a personal digital assistance, which has been widely applied into various industrial fields and various electronic products, has become an indispensable part of people life. An existing display device includes a gate driving circuit, the gate driving circuit is mainly used to scan multi-stage gate lines, so as to scan a pixel array electrically connected to the gate lines, so that an image is displayed in cooperation with other circuit structures. Due to a demand for the diversity of the gate driving circuit, one of main research trends for a developer is to design the gate driving circuit.

SUMMARY

In view of this, a bidirectional scanning unit, a driving method and a gate driving circuit are provided in the present disclosure. The bidirectional scanning unit can output scanning signals for two stages stage by stage, and a structure of the bidirectional scanning unit can be simplified by interaction between a first-stage sub unit and a second-stage sub unit, and the demand for the diversity of the gate dividing circuit can be met.

In order to realize the objectives described above, the present disclosure provides a technical solution described above.

One aspect of the present disclosure provides a bidirectional scanning unit. The bidirectional scanning unit includes a first-stage sub unit and a second-stage sub unit. The first-stage sub unit includes a first input module, a first pull-up node, a first pull-up control module, a second pull-up control module, a first pull-down node, a first pull-down control module, a second pull-down control module, a first pull-down generating module, a first output module and a first output terminal. The second-stage sub unit includes: a second input module, a second pull-up node, a third pull-up control module, a fourth pull-up control module, a second pull-down node, a third pull-down control module, a fourth pull-down control module, a second pull-down generating module, a second output module and a second output terminal.

The first input module is configured to control a conduction state between a first voltage terminal and the first pull-up node and control a conduction state between a third voltage terminal and the first output terminal in response to a signal of a first control terminal, and to control a conduction state between a second voltage terminal and the first pull-up node and control a conduction state between the third voltage terminal and the first output terminal in response to a signal of a second control terminal. A level of a signal outputted from the first voltage terminal is opposite to a level of a signal outputted from the second voltage terminal.

The second input module is configured to control a conduction state between the first voltage terminal and the second pull-up node and control a conduction state between the third voltage terminal and the second output terminal in response to a signal of a third control terminal, and to control a conduction state between the second voltage terminal and the second pull-up node and control a conduction state between the third voltage terminal and the second output terminal in response to a signal of a fourth control terminal. A structure of the first input module is identical to a structure of the second input module.

The first pull-up control module is configured to control a conduction state between the first pull-down node and the third voltage terminal and control a conduction state between the first pull-down node and the first pull-down generating module in response to a signal of the first pull-up node. The second pull-up control module is configured to control a conduction state between the first pull-down node and the third voltage terminal and control a conduction state between the first pull-down node and the first pull-down generating module in response to a signal of the second pull-up node.

The third pull-up control module is configured to control a conduction state between the second pull-down node and the third voltage terminal and control a conduction state between the second pull-down node and the second pull-down generating module in response to a signal of the second pull-up node. The fourth pull-up control module is configured to control a conduction state between the second pull-down node and the third voltage terminal and control a conduction state between the second pull-down node and the second pull-down generating module in response to a signal of the first pull-up node. A structure of the first pull-up control module is identical to a structure of the third pull-up control module, and a structure of the second pull-up control module is identical to a structure of the fourth pull-up control module.

The first pull-down generating module is configured to control a conduction state between a first signal terminal and the first pull-down node in response a signal of the first signal terminal.

The second pull-down generating module is configured to control a conduction state between a second signal terminal and the second pull-down node in response to a signal of the second signal terminal. A structure of the first pull-down generating module is identical to a structure of the second pull-down generating module.

The first pull-down control module is configured to control a conduction state between the first pull-up node and the third voltage terminal and control a conduction state between the third voltage terminal and the first output terminal in response to a signal of the first pull-down node. The second pull-down control module is configured to control a conduction state between the first pull-up node and the third voltage terminal and control a conduction state between the third voltage terminal and the first output terminal in response to a signal of the second pull-down node.

The third pull-down control module is configured to control a conduction state between the second pull-up node and the third voltage terminal and control a conduction state between the third voltage terminal and the second output terminal in response to a signal of the second pull-down node. The fourth pull-down control module is configured to control a conduction state between the second pull-up node and the third voltage terminal and control a conduction state between the third voltage terminal and the second output terminal in response to a signal of the first pull-down node. A structure of the first pull-down control module is identical to a structure of the third pull-down control module, and a structure of the second pull-down control module is identical to a structure of the fourth pull-down control module.

The first output module is configured to control a conduction state between a first clock signal terminal and the first output terminal in response to a signal of the first pull-up node. The second output module is configured to control a conduction state between a second clock signal terminal and the second output terminal in response to a signal of the second pull-up node. A phase difference between a signal outputted from the first clock signal terminal and a signal outputted from the second clock signal terminal is 180 degrees, and a structure of the first output module is identical to a structure of the second output module.

One aspect of the present disclosure provides a driving method applied into the above bidirectional scanning unit. The driving method includes a first stage, a second stage, a third stage and a fourth stage.

In a case of scanning in a direction from the first-stage sub unit to the second-stage sub unit:

in the first stage, the first input module controls to be conductive between the first voltage terminal and the first pull-up node and controls to be conductive between the third voltage terminal and the first output terminal in response to a signal of the first control terminal, wherein the first pull-up control module controls to be nonconductive between the first pull-down node and the third voltage terminal and controls to be nonconductive between the first pull-down node and the first pull-down generating module in response to a signal of the first pull-up node, the fourth pull-up control module controls to be conductive between the second pull-down node and the third voltage terminal and controls to be nonconductive between the second pull-down node and the second pull-down generating module in response to a signal of the first pull-up node, and the first output module controls to be conductive between the first clock signal terminal and the first output terminal in response to a signal of the first pull-up node;

in the second stage, the first output module controls to be conductive between the first clock signal terminal and the first output terminal in response to a signal of the first pull-up node, and a signal outputted from the first clock signal terminal is a scanning signal, the second input module controls to be conductive between the first voltage terminal and the second pull-up node and controls to be conductive between the third voltage terminal and the second output terminal in response to a signal of the third control terminal, wherein the first pull-up control module controls to be conductive between the first pull-down node and the third voltage terminal and controls to be nonconductive between the first pull-down node and the first pull-down generating module in response to a signal of the first pull-up node, the second pull-up control module controls to be conductive between the first pull-down node and the third voltage terminal and controls to be nonconductive between the first pull-down node and the first pull-down generating module in response to a signal of the second pull-up node, the third pull-up control module controls to be conductive between the second pull-down node and the third voltage terminal and controls to be nonconductive between the second pull-down node and the second pull-down generating module in response to a signal of the second pull-up node, the fourth pull-up control module controls to be conductive between the second pull-down node and the third voltage terminal and controls to be nonconductive between the second pull-down node and the second pull-down generating module in response to a signal of the first pull-up node, and the second output module controls to be conductive between the second clock signal terminal and the second output terminal in response to a signal of the second pull-up node;

in the third stage, the second output module controls to be conductive between the second clock signal terminal and the second output terminal in response to a signal of the second pull-up node, and a signal outputted from the second clock signal terminal is a scanning signal, the first input module controls to be conductive between the second voltage terminal and the first pull-up node and controls to be conductive between the third voltage terminal and the first output terminal in response to a signal of the second control terminal, wherein the third pull-up control module controls to be conductive between the second pull-down node and the third voltage terminal and controls to be nonconductive between the second pull-down node and the second pull-down generating module in response to a signal of the second pull-up node, and the second pull-up control module controls to be conductive between the first pull-down node and the third voltage terminal and controls to be nonconductive between the first pull-down node and the first pull-down generating module in response to a signal of the second pull-up node; and in the fourth stage, the second input module controls to be conductive between the second voltage terminal and the second pull-up node and controls to be conductive between the third voltage terminal and the second output terminal in response to a signal of the fourth control terminal, wherein the first pull-down generating module controls to be conductive between the first signal terminal and the first pull-down node in response to a signal of the first signal terminal, the first pull-down control module controls to be conductive between the first pull-up node and the third voltage terminal and controls to be conductive between the third voltage terminal and the first output terminal in response to a signal of the first pull-down node, the fourth pull-down control module controls to be conductive between the second pull-up node and the third voltage terminal and controls to be conductive between the third voltage terminal and the second output terminal in response to a signal of the first pull-down node; alternatively, the second pull-down generating module controls to be conductive between the second signal terminal and the second pull-down node in response to a signal of the second signal terminal, the third pull-down control module controls to be conductive between the second pull-up node and the third voltage terminal and controls to be conductive between the third voltage terminal and the second output terminal in response to a signal of the second pull-down node, and the second pull-down control module controls to be conductive between the first pull-up node and the third voltage terminal and controls to be conductive between the third voltage terminal and the first output terminal in response to a signal of the second pull-down node.

In a case of scanning in a direction from the second-stage sub unit to the first-stage sub unit:

in the first stage, the second input module controls to be conductive between the second voltage terminal and the second pull-up node and control to be conductive between the third voltage terminal and the second output terminal in response to a signal of the fourth control terminal, wherein the third pull-up control module controls to be conductive between the second pull-down node and the third voltage terminal and controls to be conductive between the second pull-down node and the second pull-down generating module in response to a signal of the second pull-up node, the second pull-up control module controls to be conductive between the first pull-down node and the third voltage terminal and controls to be conductive between the first pull-down node and the first pull-down generating module in response to a signal of the second pull-up node, and the second output module controls to be conductive between the second clock signal terminal and the second output terminal in response to a signal of the second pull-up node;

in the second stage, the second output module controls to be conductive between the second clock signal terminal and the second output terminal in response to a signal of the second pull-up node, and a signal outputted from the second clock signal terminal is the scanning signal, the first input module controls to be conductive between the second voltage terminal and the first pull-up node and controls to be conductive between the third voltage terminal and the first output terminal in response to a signal of the second control terminal, wherein the third pull-up control module controls to be conductive between the second pull-down node and the third voltage terminal and controls to be conductive between the second pull-down node and the second pull-down generating module in response to a signal of the second pull-up node, the second pull-up control module controls to be conductive between the first pull-down node and the third voltage terminal and controls to be conductive between the first pull-down node and the first pull-down generating module in response to a signal of the second pull-up node, the second output module controls to be conductive between the second clock signal terminal and the second output terminal in response to a signal of the second pull-up node, the first pull-up control module controls to be conductive between the first pull-down node and the third voltage terminal and controls to be nonconductive between the first pull-down node and the first pull-down generating module in response to a signal of the first pull-up node, the fourth pull-up control module controls to be conductive between the second pull-down node and the third voltage terminal and controls to be nonconductive between the second pull-down node and the second pull-down generating module in response to a signal of the first pull-up node, and the first output module controls to be conductive between the first clock signal terminal and the first output terminal in response to a signal of the first pull-up node;

in the third stage, the first output module controls to be conductive between the first clock signal terminal and the first output terminal in response to a signal of the first pull-up node, and a signal outputted from the first clock signal terminal is a scanning signal, the second input module controls to be conductive between the first voltage terminal and the second pull-up node and controls to be conductive between the third voltage terminal and the second output terminal in response to a signal of the third control terminal, wherein the first pull-up control module controls to be conductive between the first pull-down node and the third voltage terminal and controls to be nonconductive between the first pull-down node and the first pull-down generating module in response to a signal of the first pull-up node, and the fourth pull-up control module controls to be conductive between the second pull-down node and the third voltage terminal and controls to be nonconductive between the second pull-down node and the second pull-down generating module in response to a signal of the first pull-up node; and in the fourth stage, the first input module controls to be conductive between the first voltage terminal and the first pull-up node and controls to be conductive between the third voltage terminal and the first output terminal in response to a signal of the first control terminal, wherein the first pull-down generating module controls to be conductive between the first signal terminal and the first pull-down node in response to a signal of the first signal terminal, the first pull-down control module controls to be conductive between the first pull-up node and the third voltage terminal and controls to be conductive between the third voltage terminal and the first output terminal in response to a signal of the first pull-down node, and the fourth pull-down control module controls to be conductive between the second pull-up node and the third voltage terminal and controls to be conductive between the third voltage terminal and the second output terminal in response to a signal of the first pull-down node; alternatively, the second pull-down generating module controls to be conductive between the second signal terminal and the second pull-down node in response to a signal of the second signal terminal, the third pull-down control module controls to be conductive between the second pull-up node and the third voltage terminal and controls to be conductive between the third voltage terminal and the second output terminal in response to a signal of the second pull-down node, and the second pull-down control module controls to be conductive between the first pull-up node and the third voltage terminal and controls to be conductive between the third voltage terminal and the first output terminal in response to a signal of the second pull-down node.

One aspect of the present disclosure provides a gate driving circuit. The gate driving circuit comprises n bidirectional scanning units in n stages respectively, wherein the n bidirectional scanning units are a first-stage bidirectional scanning unit to an n-th-stage bidirectional scanning unit, each of the bidirectional scanning units is the bidirectional scanning unit described above and n is an integer no less than 2.

Compared with the conventional technology, the technical solution provided by the present disclosure at least has advantages as follows.

A bidirectional scanning unit, a driving method and a gate driving circuit are provided according to the present disclosure. The bidirectional scanning unit includes a first-stage sub unit and a second-stage sub unit, the bidirectional scanning unit can output a scanning signal stage by stage in a direction from the first-stage sub unit to the second-stage sub unit, and can also output a scanning signal stage by stage in a direction from the second-stage sub unit to the first-stage sub unit. Since that the first-stage sub unit cooperates with the second-stage sub unit in the scanning process, when one of the first-stage sub unit and the second-stage sub unit outputs the scanning signal, the other of the first-stage sub unit and the second-stage sub unit does not output the scanning signal. In the technical solution according to the present disclosure, the bidirectional scanning unit can output scanning signals for two stages stage by stage, and a structure of the bidirectional scanning unit can be simplified by interaction between the first-stage sub unit and the second-stage sub unit, and the demand for the diversity of the gate dividing circuit can be met.

BRIEF DESCRIPTION OF THE DRAWINGS

The drawings to be used in the description of the embodiments of the present disclosure or the conventional technology will be described briefly as follows, so that the technical solutions according to the embodiments of the present disclosure or according to the conventional technology will become clearer. It is apparent that the drawings in the following description only illustrate some embodiments of the present disclosure. For those skilled in the art, other drawings may be obtained based on these drawings without any creative work.

DETAILED DESCRIPTION OF THE EMBODIMENTS

Technical solutions according to embodiments of the present disclosure are described clearly and completely hereinafter in conjunction with drawings used in the embodiments of the present disclosure. Apparently, the described embodiments are only some embodiments of the present disclosure rather than all the embodiments. Any other embodiments obtained by those skilled in the art based on the embodiments of the present disclosure without any creative work fall within the scope of protection of the present disclosure.

As described in the background part, due to a demand for the diversity of a gate driving circuit, one of main research trends for a developer is to design the gate driving circuit.

Based on this, a bidirectional scanning unit, a driving method and a gate driving circuit are provided according to the embodiments of the present disclosure, the bidirectional scanning unit can output scanning signals for two stages stage by stage, and a structure of the bidirectional scanning unit can be simplified by interaction between a first-stage sub unit and a second-stage sub unit, and the demand for the diversity of the gate dividing circuit can be met. In order to realize the objectives described above, the embodiments of the present disclosure provides technical solutions as follows, and the technical solutions according to the embodiments of the present disclosure are described in detail in conjunction with FIG. 1 to FIG. 6.

Figure 1:
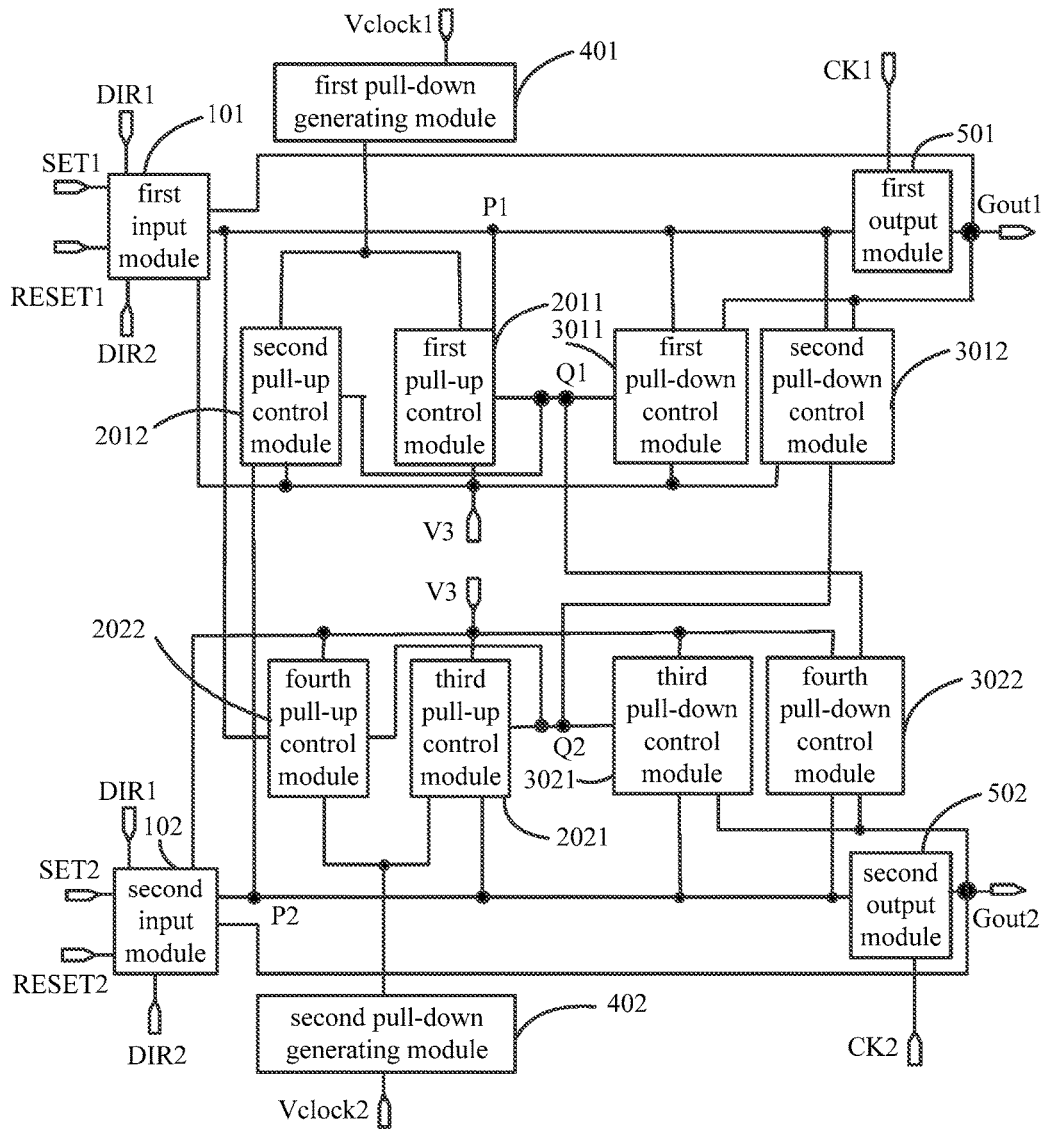
FIG. 1 is a schematic structural diagram of a bidirectional scanning unit according to an embodiment of the present disclosure.

With reference to FIG. 1, which is a schematic structural diagram of a bidirectional scanning unit according to an embodiment of the present disclosure, the bidirectional scanning unit is applied into a gate driving circuit, and the bidirectional scanning unit includes a first-stage sub unit and a second-stage sub unit.

The first-stage sub unit includes a first input module 101, a first pull-up node P1, a first pull-up control module 2011, a second pull-up control module 2012, a first pull-down node Q1, a first pull-down control module 3011, a second pull-down control module 3012, a first pull-down generating module 401, a first output module 501 and a first output terminal Gout1. The second-stage sub unit includes: a second input module 102, a second pull-up node P2, a third pull-up control module 2021, a fourth pull-up control module 2022, a second pull-down node Q2, a third pull-down control module 3021, a fourth pull-down control module 3022, a second pull-down generating module 402, a second output module 502 and a second output terminal Gout2.

The first input module 101 is configured to control a conduction state between a first voltage terminal DIR1 and the first pull-up node P1 and control a conduction state between a third voltage terminal V3 and the first output terminal Gout1 in response to a signal of a first control terminal SET1, and to control a conduction state between a second voltage terminal DIR2 and the first pull-up node P1 and control a conduction state between the third voltage terminal V3 and the first output terminal Gout1 in response to a signal of a second control terminal RESET1. A level of a signal outputted from the first voltage terminal DIR1 is opposite to a level of a signal outputted from the second voltage terminal DIR2.

The second input module 102 is configured to control a conduction state between the first voltage terminal DIR1 and the second pull-up node P2 and control a conduction state between the third voltage terminal V3 and the second output terminal Gout2 in response to a signal of a third control terminal SET2, and to control a conduction state between the second voltage terminal DIR2 and the second pull-up node P2 and control a conduction state between the third voltage terminal V3 and the second output terminal Gout2 in response to a signal of a fourth control terminal RESET2. A structure of the first input module 101 is identical to a structure of the second input module 102.

The first pull-up control module 2011 is configured to control a conduction state between the first pull-down node Q1 and the third voltage terminal V3 and control a conduction state between the first pull-down node Q1 and the first pull-down generating module 401 in response to a signal of the first pull-up node P1. The second pull-up control module 2012 is configured to control a conduction state between the first pull-down node Q1 and the third voltage terminal V3 and control a conduction state between the first pull-down node Q1 and the first pull-down generating module 401 in response to a signal of the second pull-up node P2.

The third pull-up control module 2021 is configured to control a conduction state between the second pull-down node Q2 and the third voltage terminal V3 and control a conduction state between the second pull-down node Q2 and the second pull-down generating module 402 in response to a signal of the second pull-up node P2. The fourth pull-up control module 2022 is configured to control a conduction state between the second pull-down node Q2 and the third voltage terminal V3 and control a conduction state between the second pull-down node Q2 and the second pull-down generating module 402 in response to a signal of the first pull-up node P1. A structure of the first pull-up control module 2011 is identical to a structure of the third pull-up control module 2021, and a structure of the second pull-up control module 2012 is identical to a structure of the fourth pull-up control module 2022.

The first pull-down generating module 401 is configured to control a conduction state between a first signal terminal Vclock1 and the first pull-down node Q1 in response a signal of the first signal terminal Vclock1.

The second pull-down generating module 402 is configured to control a conduction state between a second signal terminal Vclock2 and the second pull-down node Q2 in response to a signal of the second signal terminal Vclock2. A structure of the first pull-down generating module 401 is identical to a structure of the second pull-down generating module 402.

The first pull-down control module 3011 is configured to control a conduction state between the first pull-up node P1 and the third voltage terminal V3 and control a conduction state between the third voltage terminal V3 and the first output terminal Gout1 in response to a signal of the first pull-down node Q1. The second pull-down control module 3012 is configured to control a conduction state between the first pull-up node P1 and the third voltage terminal V3 and control a conduction state between the third voltage terminal V3 and the first output terminal Gout1 in response to a signal of the second pull-down node Q2.

The third pull-down control module 3021 is configured to control a conduction state between the second pull-up node P2 and the third voltage terminal V3 and control a conduction state between the third voltage terminal V3 and the second output terminal Gout2 in response to a signal of the second pull-down node Q2. The fourth pull-down control module 3022 is configured to control a conduction state between the second pull-up node P2 and the third voltage terminal V3 and control a conduction state between the third voltage terminal V3 and the second output terminal Gout2 in response to a signal of the first pull-down node Q1. A structure of the first pull-down control module 3011 is identical to a structure of the third pull-down control module 3021, a structure of the second pull-down control module 3012 is identical to a structure of the fourth pull-down control module 3022.

The first output module 501 is configured to control a conduction state between a first clock signal terminal CK1 and the first output terminal Gout1 in response to a signal of the first pull-up node P1, and the second output module 502 is configured to control a conduction state between a second clock signal terminal CK2 and the second output terminal Gout2 in response to a signal of the second pull-up node P2. A phase difference between a signal outputted from the first clock signal terminal CK1 and a signal outputted from the second clock signal terminal CK2 is 180 degrees, and a structure of the first output module 501 is identical to a structure of the second output module 502.

The bidirectional scanning unit according to the embodiment of the present disclosure includes a first-stage sub unit and a second-stage sub unit, the bidirectional scanning unit can scan in a direction from the first-stage sub unit to the second-stage sub unit, and also can scan in a direction from the second-stage sub unit to the first-stage sub unit, thereby realizing bidirectional scanning. In addition, a structure of a composition module of the first-stage sub unit is identical to a structure of a composition module of the second-stage sub unit, and composition structures of the modules are identical to each other. The first-stage sub unit interacts with the second-stage sub unit in the scanning process, therefore, when one of the first-stage sub unit and the second-stage sub unit outputs a scanning signal, the other of the first-stage sub unit and the second-stage sub unit does not output a scanning signal, thereby meeting an objective that the first-stage sub unit and the second-stage sub unit outputs the scanning signal stage by stage. Also, the first-stage sub unit interacts with the second-stage sub unit, an external circuit is not required to control the first-stage sub unit and the second-stage sub unit in the scanning process, thereby ensuring that a circuit structure of the bidirectional scanning unit is simple and is easy to be implemented.

Figure 2:
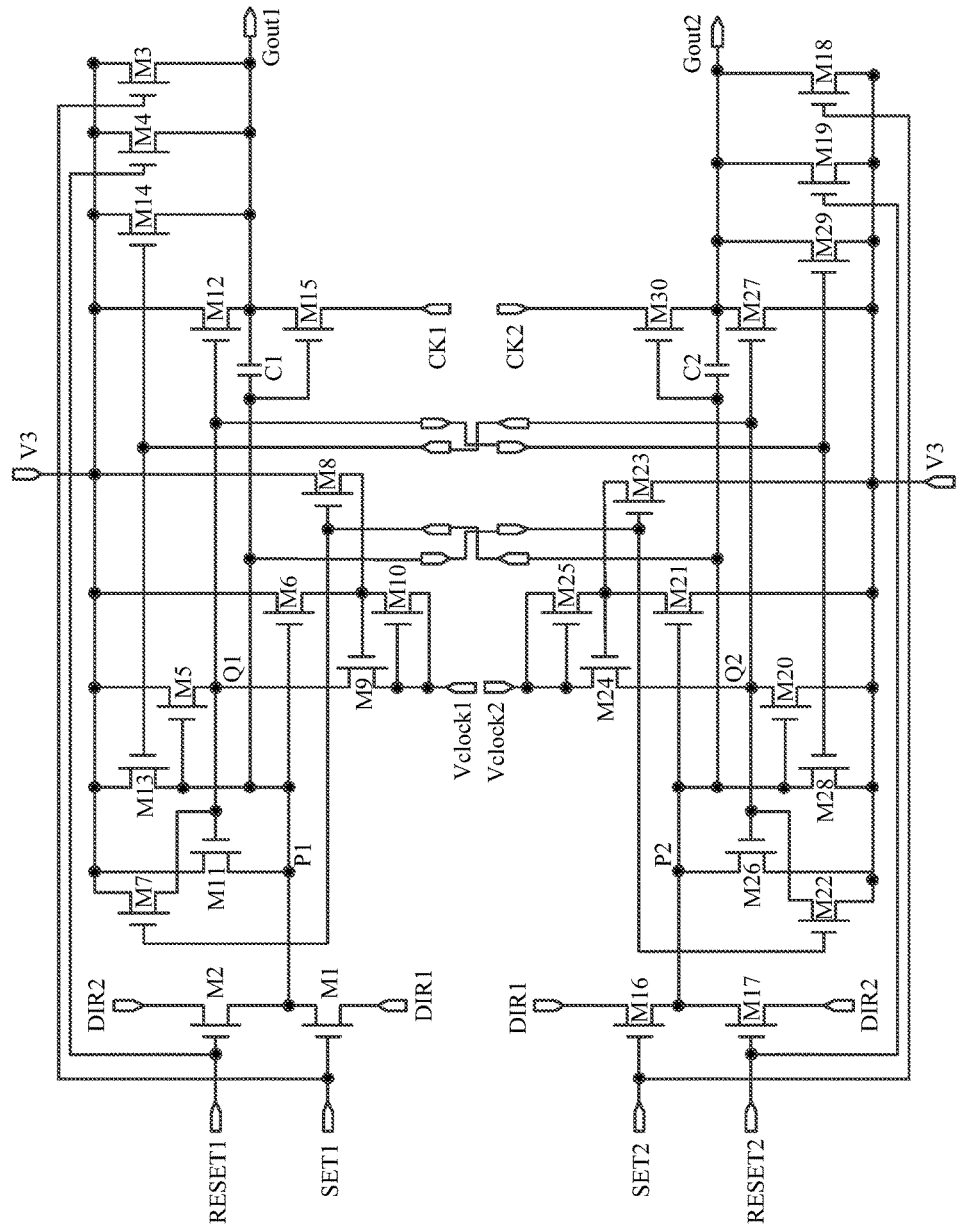
FIG. 2 is a schematic structural diagram of a bidirectional scanning unit according to another embodiment of the present disclosure.

A specific bidirectional scanning unit according to the embodiment of the present disclosure is described in detail in conjunction with FIG. 2. FIG. 2 is a schematic structural diagram of a bidirectional scanning unit according to another embodiment of the present disclosure.

With reference to FIG. 2, the first input module 101 in the embodiment of the present disclosure includes a first transistor M1, a second transistor M2, a third transistor M3 and a fourth transistor M4.

A gate of the first transistor M1 is connected to the first control terminal SET1, a first terminal of the first transistor M1 is connected to the first voltage terminal DIR1, and a second terminal of the first transistor M1 is connected to the first pull-up node P1. A gate of the second transistor M2 is connected to the second control terminal RESET1, a first terminal of the second transistor M2 is connected to the second voltage terminal DIR2, and a second terminal of the second transistor M2 is connected to the first pull-up node P1. A gate of the third transistor M3 is connected to the first control terminal SET1, a first terminal of the third transistor M3 is connected to the third voltage terminal V3, and a second terminal of the third transistor M3 is connected to the first output terminal Gout1. A gate of the fourth transistor M4 is connected to the second control terminal RESET1, a first terminal of the fourth transistor M4 is connected to the third voltage terminal V3, and a second terminal of the fourth transistor M4 is connected to the first output terminal Gout1.

Since that a composition structure of the first input module 101 is identical to a composition structure of the second input module 102, similarly, the second input module 102 includes four transistors, i.e. a sixteenth transistor M16, a seventeenth transistor M17, an eighteenth transistor M18 and a nineteenth transistor M19.

A gate of the sixteenth transistor M16 is connected to the third control terminal SET2, a first terminal of the sixteenth transistor M16 is connected to the first voltage terminal DIR1, and a second terminal of the sixteenth transistor M16 is connected to the second pull-up node P2. A gate of the seventeenth transistor M17 is connected to the fourth control terminal RESET2, a first terminal of the seventeenth transistor M17 is connected to the second voltage terminal DIR2, and a second terminal of the seventeenth transistor M17 is connected to the second pull-up node P2. A gate of the eighteenth transistor M18 is connected to the third control terminal SET2, a first terminal of the eighteenth transistor M18 is connected to the third voltage terminal V3, and a second terminal of the eighteenth transistor M18 is connected to the second output terminal Gout2. A gate of the nineteenth transistor M19 is connected to the fourth control terminal RESET2, a first terminal of the nineteenth transistor M19 is connected to the third voltage terminal V3, and a second terminal of the nineteenth transistor M19 is connected to the second output terminal Gout2.

It should be noted that conduction types of the first transistor M1, the second transistor M2, the third transistor M3 and the fourth transistor M4 are identical to each other, and conduction types of the sixteenth transistor M16, the seventeenth transistor M17, the eighteenth transistor M18 and the nineteenth transistor M19 are identical to each other. In addition, a signal of the first pull-up node P1 and a signal of the second pull-up node P2 have to be determined in the embodiment of the present disclosure. Therefore, with respect to the first input module 101, the second control terminal RESET1 can not control to be conductive between the first pull-up node P1 and the second voltage terminal DIR2 when the first control terminal SET1 controls to be conductive between the first pull-up node P1 and the first voltage terminal DIR1, and the first control terminal SET1 can not control to be conductive between the first pull-up node P1 and the first voltage terminal DIR1 when the second control terminal RESET1 controls to be conductive between the first pull-up node P1 and the second voltage terminal DIR2. Similarly, with respect to the second input module 102, the fourth control terminal RESET2 can not control to be conductive between the second pull-up node P2 and the second voltage terminal DIR2 when the third control terminal SET2 controls to be conductive between the second pull-up node P2 and the first voltage terminal DIR1, and the third control terminal SET2 can not control to be conductive between the second pull-up node P2 and the first voltage terminal DIR1 when the fourth control terminal RESET2 controls to be conductive between the second pull-up node P2 and the second voltage terminal DIR2. That is, the first transistor M1 and the second transistor M2 can not be turned on simultaneously, and the sixteenth transistor M16 and the seventeenth transistor M17 can not be turned on simultaneously.

In addition, a signal outputted from the third voltage terminal V3 according to the embodiment of the present disclosure may be a high-level signal or a low-level signal, which is designed according to actual needs, as long as the signal outputted from the third voltage terminal V3 can not scan a gate line (that is, the signal can not scan a pixel array connected to the gate line) and can not control the transistor being directly or indirectly conductive with the third voltage terminal V3 to be turned on.

With reference to FIG. 2, the first pull-up control module 2011 according to the embodiment of the present disclosure includes a fifth transistor M5 and a sixth transistor M6.

A gate of the fifth transistor M5 is connected to the first pull-up node P1, a first terminal of the fifth transistor M5 is connected to the third voltage terminal V3, and a second terminal of the fifth transistor M5 is connected to the first pull-down node Q1. A gate of the sixth transistor M6 is connected to the first pull-up node P1, a first terminal of the sixth transistor M6 is connected to the third voltage terminal V3, and a second terminal of the sixth transistor M6 is connected to the first pull-down generating module 401.

Since that a composition structure of the first pull-up control module 2011 is identical to a composition structure of the third pull-up control module 2021, similarly, the third pull-up control module 2021 includes two transistors, i.e. a twentieth transistor M20 and a twenty-first transistor M21.

A gate of the twentieth transistor M20 is connected to the second pull-up node P2, a first terminal of the twentieth transistor M20 is connected to the third voltage terminal V3, and a second terminal of the twentieth transistor M20 is connected to the second pull-down node Q2. A gate of the twenty-first transistor M21 is connected to the second pull-up node P2, a first terminal of the twenty-first transistor M21 is connected to the third voltage terminal V3, and a second terminal of the twenty-first transistor M21 is connected to the second pull-down generating module 402.

With reference to FIG. 2, the second pull-up control module 2012 includes a seventh transistor M7 and an eighth transistor M8.

A gate of the seventh transistor M7 is connected to the second pull-up node P2, a first terminal of the seventh transistor M7 is connected to the third voltage terminal V3, and a second terminal of the seventh transistor M7 is connected to the first pull-down node Q1. A gate of the eighth transistor M8 is connected to the second pull-up node P2, a first terminal of the eighth transistor M8 is connected to the third voltage terminal V3, and a second terminal of the eighth transistor M8 is connected to the first pull-down generating module 401.

Since that a composition structure of the second pull-up control module 2012 is identical to a composition structure of the fourth pull-up control module 2022, similarly, the fourth pull-up control module 2022 includes two transistors, i.e. a twenty-second transistor M22 and a twenty-third transistor M23.

A gate of the twenty-second transistor M22 is connected to the first pull-up node P1, a first terminal of the twenty-second transistor M22 is connected to the third voltage terminal V3, and a second terminal of the twenty-second transistor M22 is connected to the second pull-down node Q2. A gate of the twenty-third transistor M23 is connected to the first pull-up node P1, a first terminal of the twenty-third transistor M23 is connected to the third voltage terminal V3, and a second terminal of the twenty-third transistor M23 is connected to the second pull-down generating module 402.

Also, with reference to FIG. 2, the first pull-down generating module 401 according to the embodiment of the present disclosure includes a ninth transistor M9 and a tenth transistor M10.

A gate of the ninth transistor M9 is connected to the second terminals of the sixth transistor M6 and the eighth transistor M8, a first terminal of the ninth transistor M9 is connected to the first signal terminal Vclock1, and a second terminal of the ninth transistor M9 is connected to the first pull-down node Q1. Each of a gate and a first terminal of the tenth transistor M10 is connected to the first signal terminal Vclock1, and a second terminal of the tenth transistor M10 is connected to the second terminals of the sixth transistor M6 and the eighth transistor M8.

Since that a composition structure of the first pull-down generating module 401 is identical to a composition structure of the second pull-down generating module 402, similarly, the second pull-down generating module 402 includes two transistors, i.e. a twenty-fourth transistor M24 and a twenty-fifth transistor M25.

A gate of the twenty-fourth transistor M24 is connected to the second terminals of the twenty-first transistor M21 and the twenty-third transistor M23, a first terminal of the twenty-fourth transistor M24 is connected to the second signal terminal Vclock2, and a second terminal of the twenty-fourth transistor M24 is connected to the second pull-down node Q2. Each of a gate and a first terminal of the twenty-fifth transistor M25 is connected to the second signal terminal Vclock2, and a second terminal of the twenty-fifth transistor M25 is connected to the second terminals of the twenty-first transistor M21 and the twenty-third transistor M23.

It should be noted that conduction types of the fifth transistor M5, the sixth transistor M6, the seventh transistor M7, the eighth transistor M8, the twentieth transistor M20, the twenty-first transistor M21, the twenty-second transistor M22 and the twenty-third transistor M23 are identical to each other, and conduction types of the ninth transistor M9, the tenth transistor M10, the twenty-fourth transistor M24, the twenty-fifth transistor M25 are identical with each other. Specifically, when the sixth transistor M6 and/or the eighth transistor M8 are turned on, it has to be ensured that it is nonconductive between the first pull-down generating module 401 and the first pull-down node Q1, therefore, a signal outputted from the third voltage terminal V3 has to control to be nonconductive between the first pull-down generating module 401 and the first pull-down node Q1. Also, when the twenty-first transistor M21 and/or the twenty-third transistor M23 are turned on, it has to be also ensured that it is nonconductive between the second pull-down generating module 402 and the second pull-down node Q2, therefore, a signal outputted from the third voltage terminal V3 has to control be nonconductive between the second pull-down generating module 402 and the second pull-down node Q2. In an embodiment of the present disclosure, in order to ensure that the signal outputted from the third voltage terminal V3 controls to be nonconductive between the pull-down generating module and the pull-down node, each of width to length ratios of the sixth transistor M6 and the eighth transistor M8 is greater than a width to length ratio of the tenth transistor M10, and each of width to length ratios of the twenty-first transistor M21 and the twenty-third transistor M23 is greater than a width to length ratio of the twenty-fifth transistor M25. Ranges of the width to length ratios of the sixth transistor M6, the eighth transistor M8, the tenth transistor M10, the twenty-first transistor M21, the twenty-third transistor M23 and the twenty-fifth transistor M25 are not limited in the present disclosure, which can be designed according to actual needs.

With reference to FIG. 2, the first pull-down control module 3011 according to the embodiment of the present disclosure includes an eleventh transistor M11 and a twelfth transistor M12.

A gate of the eleventh transistor M11 is connected to the first pull-down node Q1, a first terminal of the eleventh transistor M11 is connected to the third voltage terminal V3, and a second terminal of the eleventh transistor M11 is connected to the first pull-up node Pb. A gate of the twelfth transistor M12 is connected to the first pull-down node Q1, a first terminal of the twelfth transistor M12 is connected to the third voltage terminal V3, and a second terminal of the twelfth transistor M12 is connected to the first output terminal Gout1.

Since that a composition structure of the first pull-down control module 3011 is identical to a composition structure of the third pull-down control module 3021, similarly, the third pull-down control module 3021 includes two transistors, i.e. a twenty-sixth transistor M26 and a twenty-seventh transistor M27.

A gate of the twenty-sixth transistor M26 is connected to the second pull-down node Q2, a first terminal of the twenty-sixth transistor M26 is connected to the third voltage terminal V3, and a second terminal of the twenty-sixth transistor M26 is connected to the second pull-up node P2. A gate of the twenty-seventh transistor M27 is connected to the second pull-down node Q2, a first terminal of the twenty-seventh transistor M27 is connected to the third voltage terminal V3, and a second terminal of the twenty-seventh transistor M27 is connected to the second output terminal Gout2.

The second pull-down control module 3012 according to the embodiment of the present disclosure includes a thirteenth transistor M13 and a fourteenth transistor M14.

A gate of the thirteenth transistor M13 is connected to the second pull-down node Q2, a first terminal of the thirteenth transistor M13 is connected to the third voltage terminal V3, and a second terminal of the thirteenth transistor M13 is connected to the first pull-up node P1. A gate of the fourteenth transistor M14 is connected to the second pull-down node Q2, a first terminal of the fourteenth transistor M14 is connected to the third voltage terminal V3, and a second terminal of the fourteenth transistor M14 is connected to the first output terminal Gout1.

Since that a composition structure of the second pull-down control module 3012 is identical to a composition structure of the fourth pull-down control module 3022, similarly, the fourth pull-down control module 3022 includes two transistors, i.e. a twenty-eighth transistor M28 and a twenty-ninth transistor M29.

A gate of the twenty-eighth transistor M28 is connected to the first pull-down node Q1, a first terminal of the twenty-eighth transistor M28 is connected to the third voltage terminal V3, and a second terminal of the twenty-eighth transistor M28 is connected to the second pull-up node P2. A gate of the twenty-ninth transistor M29 is connected to the first pull-down node Q1, a first terminal of the twenty-ninth transistor M29 is connected to the third voltage terminal V3, and a second terminal of the twenty-ninth transistor M29 is connected to the second output terminal Gout2.

With reference to FIG. 2, the first output module 501 according to the embodiment of the present disclosure includes a fifteenth transistor M15 and a first bootstrap capacitor C1.

Each of a gate of the fifteenth transistor M15 and a first polar plate of the first bootstrap capacitor C1 is connected to the first pull-up node P1, a first terminal of the fifteenth transistor M15 is connected to the first clock signal terminal CK1, and a second terminal of the fifteen transistor M15 and a second polar plate of the first bootstrap capacitor C1 are connected together as the first output terminal Gout1, that is, the second terminal of the fifteenth transistor M15 is connected to the second polar plate of the first bootstrap capacitor C1, and is connected to the first output terminal Gout1.

Since that a composition structure of the first output module 501 is identical to a composition structure of the second output module 502, similarly, the second output module 502 includes a transistor and a bootstrap capacitor, i.e. a thirtieth transistor M30 and a second bootstrap capacitor C2.

Each of a gate of the thirtieth transistor M30 and a first polar plate of the second bootstrap capacitor C2 is connected to the second pull-up node P2, a first terminal of the thirtieth transistor M30 is connected to the second clock signal terminal CK2, and a second terminal of the thirtieth transistor M30 and a second polar plate of the second bootstrap capacitor C2 are connected together as the second output terminal Gout2, that is, the second terminal of the thirtieth transistor M30 is connected to the second polar plate of the second bootstrap capacitor C2, and is connected to the second output terminal Gout2.

In any one of the embodiments of the present disclosure, a level of a signal outputted from the first signal terminal Vclock1 may be identical to a level of a signal outputted form the second signal terminal Vclock2 in the present disclosure. In addition, in order to reduce power consumption, a level of a signal outputted from the first signal terminal Vclock1 may be opposite to a level of a signal outputted form the second signal terminal Vclock2 in the present disclosure. Each of the signal outputted from the first signal terminal Vclock1 and the signal outputted from the second signal terminal Vclock2 is a signal inverted once a frame, that is, after an image of one frame is scanned by the gate driving circuit, each of the signal outputted from the first signal terminal Vclock1 and the signal outputted from the second signal terminal Vclock2 is inverted. Each transistor in the present disclosure is preferably a thin film transistor.

Each of the composition modules of the bidirectional scanning unit according to the embodiment of the present disclosure and a turn-on state and a turn-off state of each of the transistors in each module are further described below in conjunction with a driving method. It should be noted that the description is performed by taking a case that each of the first transistor M1 to the thirtieth transistor M30 is a N-type transistor, a signal outputted from the third voltage terminal V3 is a low-level signal and a scanning signal is a high-level signal as an example.

The driving method according to the embodiment of the present disclosure is described in detail in conjunction with FIG. 1, FIG. 2, FIG. 3a and FIG. 3b. The driving method according to the embodiment of the present disclosure is applied into the bidirectional scanning unit described above, the driving method includes a first stage T1, a second stage T2, a third stage T3 and a fourth stage T4.

Figure 3A:
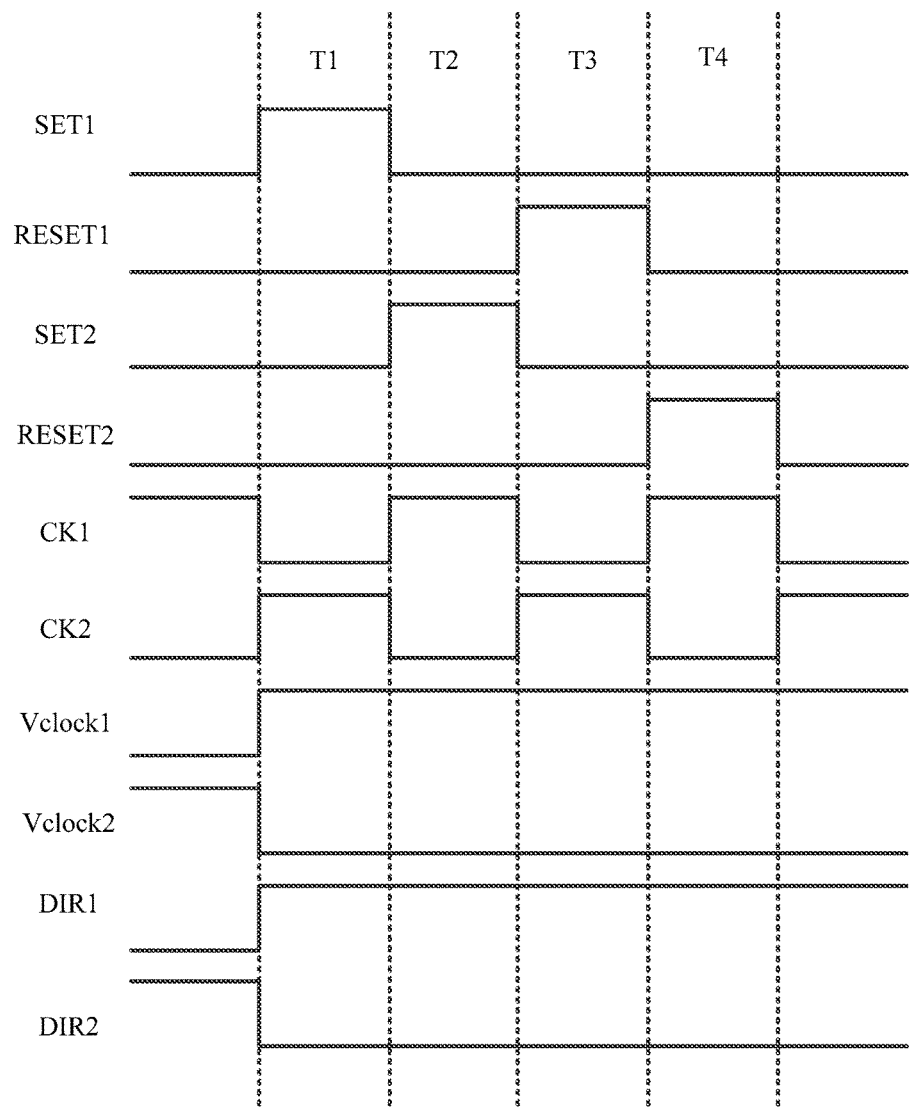
FIG. 3a is a sequence diagram of forward scanning according to an embodiment of the present disclosure.

Reference is made to FIG. 3a, which is a sequence diagram of forward scanning according to an embodiment of the present disclosure. The scanning is performed in a direction from the first-stage sub unit to the second-stage sub unit, a signal outputted from the first voltage terminal DIR1 is a high-level signal, and a signal outputted from the second voltage terminal DIR2 is a low-level signal. The first stage T1 to the fourth stage T4 in a case of scanning in the direction from the first-stage sub unit to the second-stage sub unit are described below.

In the first stage T1, the first input module 101 controls to be conductive between the first voltage terminal DIR1 and the first pull-up node P1 and controls to be conductive between the third voltage terminal V3 and the first output terminal Gout1 in response to a signal of the first control terminal SET1. The first pull-up control module 2011 controls to be nonconductive between the first pull-down node Q1 and the third voltage terminal V3 and controls to be nonconductive between the first pull-down node Q1 and the first pull-down generating module 401 in response to a signal of the first pull-up node P1. The fourth pull-up control module 2022 controls to be conductive between the second pull-down node Q2 and the third voltage terminal V3 and controls to be nonconductive between the second pull-down node Q2 and the second pull-down generating module 402 in response to a signal of the first pull-up node P1. The first output module 501 controls to be conductive between the first clock signal terminal CK1 and the first output terminal Gout1 in response to a signal of the first pull-up node P1.

Specifically, as shown in conjunction with FIG. 2 and FIG. 3a, in the first stage T1, the first control terminal SET1 outputs a high-level signal, and then controls the first transistor M1 and the third transistor M3 to be turned on, so that a signal of the first pull-up node P1 is a high-level signal outputted from the first voltage terminal DIR1, and a signal of the first output terminal Gout1 is a low-level signal outputted from the third voltage terminal V3. The first pull-up node P1 controls the fifth transistor M5 and the sixth transistor M6 to be turned on, and then controls the twenty-second transistor M22 and the twenty-third transistor M23 to be turned on, so that each of a signal of the first pull-down node Q1 and a signal of the second pull-down node Q2 is a low-level signal outputted from the third voltage terminal V3, and the first pull-up node P1 controls to be nonconductive between the first pull-down generating module 401 and the first pull-down node Q1 and controls to be nonconductive between the second pull-down generating module 402 and the second pull-down node Q2. The first pull-up node P1 also controls the fifteenth transistor M15 to be turned on, and outputs a low-level signal outputted from the first clock signal terminal CK1 to the first output terminal Gout1.

In the second stage T2, the first output module 501 controls to be conductive between the first clock signal terminal CK1 and the first output terminal Gout1 in response to a signal of the first pull-up node P1, and a signal outputted from the first clock signal terminal CK1 is a scanning signal. The second input module 102 controls to be conductive between the first voltage terminal DIR1 and the second pull-up node P2 and controls to be conductive between the third voltage terminal V3 and the second output terminal Gout2 in response to a signal of the third control terminal SET2. The first pull-up control module 2011 controls to be conductive between the first pull-down node Q1 and the third voltage terminal V3 and controls to be nonconductive between the first pull-down node Q1 and the first pull-down generating module 401 in response to a signal of the first pull-up node P1. The second pull-up control module 2012 controls to be conductive between the first pull-down node Q1 and the third voltage terminal V3 and controls to be nonconductive between the first pull-down node Q1 and the first pull-down generating module 401 in response to a signal of the second pull-up node P2. The third pull-up control module 2021 controls to be conductive between the second pull-down node Q2 and the third voltage terminal V3 and controls to be nonconductive between the second pull-down node Q2 and the second pull-down generating module 402 in response to a signal of the second pull-up node P2. The fourth pull-up control module 2022 controls to be conductive between the second pull-down node Q2 and the third voltage terminal V3 and controls to be nonconductive between the second pull-down node Q2 and the second pull-down generating module 402 in response to a signal of the first pull-up node P1. The second output module 502 controls to be conductive between the second clock signal terminal CK2 and the second output terminal Gout2 in response to a signal of the second pull-up node P2.

Specifically, as shown in conjunction with FIG. 2 and FIG. 3a, in the stage T2, the fifteenth transistor M15 outputs a high-level signal (i.e. the scanning signal) outputted from the first clock signal terminal CK1 to the first output terminal Gout1 and one polar plate of the first bootstrap capacitor C1, the first output terminal Gout1 scans a gate line connected to the first output terminal Gout1, and the first bootstrap capacitor C1 pulls up a signal of the first pull-up node P1 connected to the other polar plate of the first bootstrap capacitor C1. Since that a signal of the first pull-up node P1 is a high-level signal having a higher level than the scanning signal, the transistor being directly or indirectly conductive with the first pull-up node P1 maintains its state in the first stage T1. In addition, in the second stage T2, the third control terminal SET2 outputs a high-level signal and controls the sixteenth transistor M16 and the eighteenth transistor M18 to be turned on, so that a signal of the second pull-up node P2 is a high-level signal outputted from the first voltage terminal DIR1, and the second output terminal Gout2 outputs a low-level signal outputted from the third voltage terminal V3. The second pull-up node P2 controls the twentieth transistor M20 and the twenty-first transistor M21 to be turned on, and controls the seventh transistor M7 and the eighth transistor M8 to be turned on, so that each of a signal of the second pull-down node Q2 and a signal of the first pull-down node Q1 is the low-level signal outputted from the third voltage terminal V3, and the second pull-up node P2 keeps controlling to be nonconductive between the first pull-down generating module 401 and the first pull-down node Q1 and to be nonconductive between the second pull-down generating module 402 and the second pull-down node Q2. The second pull-up node P2 also controls the thirtieth transistor M30 to be turned on, the thirtieth transistor M30 outputs a low-level signal outputted from the second clock signal terminal CK2 to the second output terminal Gout2.

In the third stage T3, the second output terminal 502 controls to be conductive between the second clock signal terminal CK2 and the second output terminal Gout2 in response to a signal of the second pull-up node P2, and a signal outputted from the second clock signal terminal is a scanning signal. The first input module 101 controls to be conductive between the second voltage terminal DIR2 and the first pull-up node P1 and controls to be conductive between the third voltage terminal V3 and the first output terminal Gout1 in response to a signal of the second control terminal RESET1. The third pull-up control module 2021 controls to be conductive between the second pull-down node Q2 and the third voltage terminal V3 and controls to be nonconductive between the second pull-down node Q2 and the second pull-down generating module 402 in response to a signal of the second pull-up node P2. The second pull-up control module 2012 controls to be conductive between the first pull-down node Q1 and the third voltage terminal V3 and controls to be nonconductive between the first pull-down node Q1 and the first pull-down generating module 401 in response to a signal of the second pull-up node P2.

Specifically, as shown in conjunction with FIG. 2 and FIG. 3a, in the third stage T3, the thirtieth transistor M30 outputs the high-level signal (i.e. the scanning signal) outputted from the second clock signal terminal CK2 to the second output terminal Gout2 and one polar plate of the second bootstrap capacitor C2. The second output terminal Gout2 scans a gate line connected to the second output terminal Gout2, and the second bootstrap capacitor C2 pulls up a signal of the second pull-up node P2 connected to the other polar plate of the second bootstrap capacitor C2. Since that a signal of the second pull-up node P2 is a high-level signal having a higher level than the scanning signal, the transistor being directly or indirectly conductive with the second pull-up node P2 maintains its state in the second stage T2. In addition, in the third stage T3, the second control terminal RESET1 outputs a high-level signal and controls the second transistor M2 and the fourth transistor M4 to be turned on, so that a signal of the first pull-up node P1 is a low-level signal outputted from the second voltage terminal DIR2, and a signal of the first output terminal Gout1 is a low-level signal outputted from the third voltage terminal V3. In this case, each of the transistors connected to the first pull-up node P1 is in a turn-off state.

In the fourth stage T4, the second input module 102 controls to be conductive between the second voltage terminal DIR2 and the second pull-up node P2 and controls to be conductive between the third voltage terminal V3 and the second output terminal Gout2 in response to a signal of the fourth control terminal RESET2. The first pull-down generating module 401 controls to be conductive between the first signal terminal Vclock1 and the first pull-down node Q1 in response to a signal of the first signal terminal Vclock1, the first pull-down control module 3011 controls to be conductive between the first pull-up node P1 and the third voltage terminal V3 and controls to be conductive between the third voltage terminal V3 and the first output terminal Gout1 in response to a signal of the first pull-down node Q1, the fourth pull-down control module 3022 controls to be conductive between the second pull-up node P2 and the third voltage terminal V3 and controls to be conductive between the third voltage terminal V3 and the second output terminal Gout2 in response to a signal of the first pull-down node Q1. Alternatively, the second pull-down generating module 402 controls to be conductive between the second signal terminal Vclock2 and the second pull-down node Q2 in response to a signal of the second signal terminal Vclock2, the third pull-down control module 3021 controls to be conductive between the second pull-up node P2 and the third voltage terminal V3 and controls to be conductive between the third voltage terminal V3 and the second output terminal Gout2 in response to a signal of the second pull-down node Q2, the second pull-down control module 3012 controls to be conductive between the first pull-up node P1 and the third voltage terminal V3 and controls to be conductive between the third voltage terminal V3 and the first output terminal Gout1 in response to a signal of the second pull-down node Q2.

Specifically, as shown in conjunction with FIG. 2 and FIG. 3a, in the fourth stage T4, the fourth control terminal RESET2 outputs a high-level signal, and controls the seventeenth transistor M17 and a nineteenth transistor M19 to be turned on, so that a signal of the second pull-up node P2 is a low-level signal outputted from the second voltage terminal DIR2, and a signal of the second output terminal Gout2 is a low-level signal outputted from the third voltage terminal V3. Since that in the fourth stage T4, each of the transistors connected to the first pull-up node P1 and the second pull-up node P2 is in a turn-off state, the first pull-down generating module 401 can not be prevented from being conductive with the first pull-down node Q1, and the second pull-down generating module 402 can not be prevented from being conductive with the second pull-down node Q2. With reference to FIG. 3a, in an embodiment of the present disclosure, a signal outputted form the first signal terminal Vclock1 is a high-level signal, and a signal outputted from the second signal terminal Vclock2 is a low-level signal, therefore, the tenth transistor M10 of the first pull-down generating module 401 transmits the high-level signal to a gate of the ninth transistor M9 in response to the high-level signal outputted from the first signal terminal Vclock1 to turn on the ninth transistor M9, and the high-level signal outputted from the first signal terminal Vclock1 is outputted to the first pull-down node Q1 after the ninth transistor M9 is turned on. The first pull-down node Q1 controls the eleventh transistor M11 and the twelfth transistor M12 to be turned on, and controls the twenty-eighth transistor M28 and the twenty-ninth transistor M29 to be turned on, so that each of the signal of the first pull-up node P1, the signal of the second pull-up node P2, the signal of the first output terminal Gout1 and the signal of the second output terminal Gout2 is the low-level signal outputted from the third voltage terminal V3.

In addition, in the forward scanning, the signal of the second signal terminal Vclock2 may also be a high-level signal, and the signal of the first signal terminal Vclock1 may be a low-level signal, which is not limited in the present disclosure.

Figure 3B:
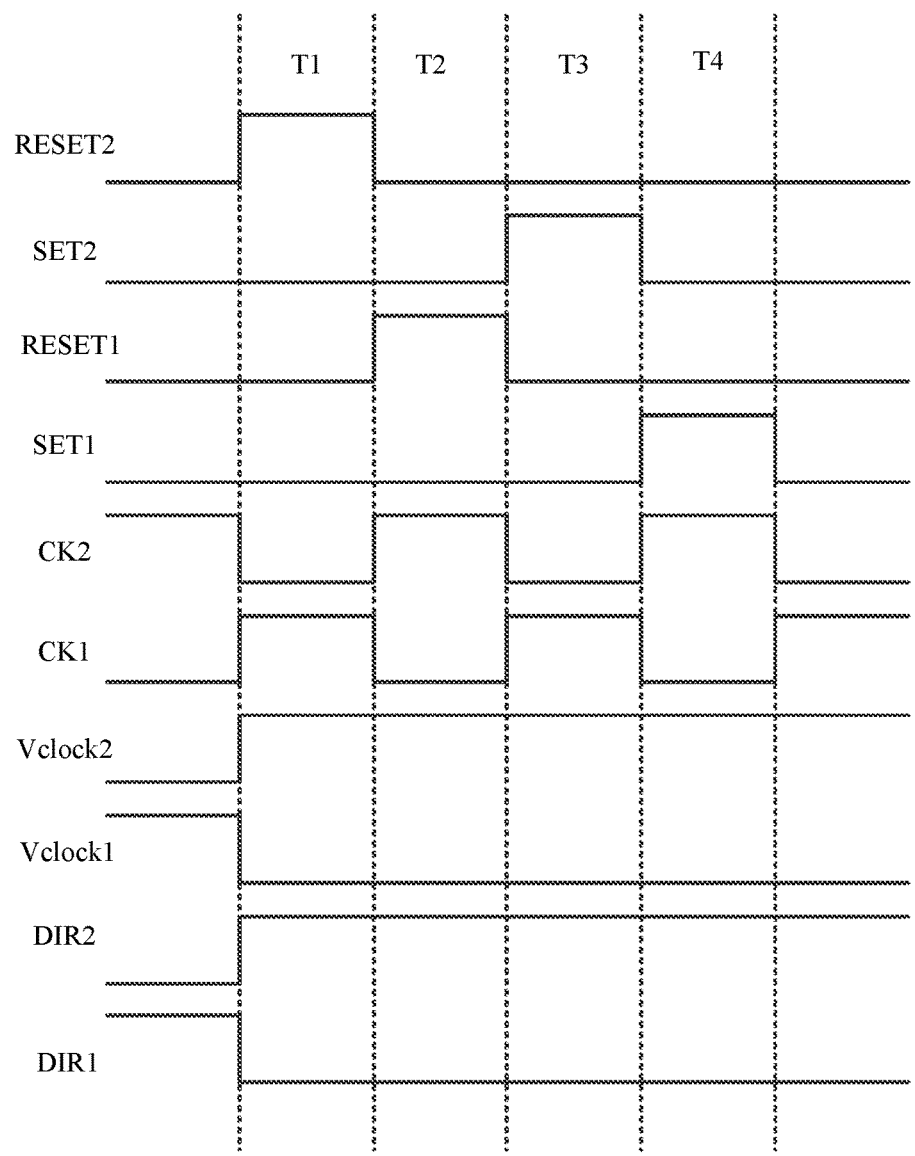
FIG. 3b is a sequence diagram of reverse scanning according to an embodiment of the present disclosure.

Reference is made to FIG. 3b, which is a sequence diagram of reverse scanning according to an embodiment of the present disclosure. The scanning is performed in a direction from the second-stage sub unit to the first-stage sub unit, in this case, each of the signal outputted from the first voltage terminal DIR1 and the signal outputted from the second voltage terminal DIR2 is inverted, that is, the first voltage terminal DIR1 outputs a low-level signal, and the second voltage terminal DIR2 outputs a high-level signal. The first stage T1 to the fourth stage T4 in a case of scanning in a direction from the second-stage sub unit to the first-stage sub unit are described below.

In the first stage T1, the second input module 102 controls to be conductive between the second voltage terminal DIR2 and the second pull-up node P2 and controls to be conductive between the third voltage terminal V3 and the second output terminal Gout2 in response to a signal of the fourth control terminal RESET2. The third pull-up control module 2021 controls to be conductive between the second pull-down node Q2 and the third voltage terminal V3 and controls to be conductive between the second pull-down node Q2 and the second pull-down generating module 402 in response to a signal of the second pull-up node P2. The second pull-up control module 2012 controls to be conductive between the first pull-down node Q1 and the third voltage terminal V3 and controls to be conductive between the first pull-down node Q1 and the first pull-down generating module 401 in response to a signal of the second pull-up node P2. The second output module 502 controls to be conductive between the second clock signal terminal CK2 and the second output terminal Gout2 in response to a signal of the second pull-up node P2.

Specifically, as shown in conjunction with FIG. 2 and FIG. 3b, in the first stage T1, the fourth control terminal RESET2 outputs a high-level signal, and controls the seventeenth transistor M17 and the nineteenth transistor M19 to be turned on, so that a signal of the second pull-up node P2 is a high-level signal outputted from the second voltage terminal DIR2, and a signal of the first output terminal Gout1 is a low-level signal outputted from the third voltage terminal V3. The second pull-up node P2 controls the twentieth transistor M20 and the twenty-first transistor M21 to be turned on, and controls the seventh transistor M7 and the eighth transistor M8 to be turned on, so that a signal of the second pull-down node Q2 is the low-level signal outputted from the third voltage terminal V3, and the first pull-down generating module 401 is nonconductive with the first pull-down node Q1, and the second pull-down generating module 402 is nonconductive with the second pull-down node Q2. The second pull-up node P2 also controls the thirtieth transistor M30 to be turned on, the thirtieth transistor M30 outputs a low-level signal outputted from the second clock signal terminal CK2 to the second output terminal Gout2.

In the second stage T2, the second output module 502 controls to be conductive between the second clock signal terminal CK2 and the second output terminal Gout2 in response to a signal of the second pull-up node P2, and a signal outputted from the second clock signal terminal CK2 is the scanning signal. The first input module 101 controls to be conductive between the second voltage terminal DIR2 and the first pull-up node P1 and controls to be conductive between the third voltage terminal V3 and the first output terminal Gout1 in response to a signal of the second control terminal RESET1. The third pull-up control module 2021 controls to be conductive between the second pull-down node Q2 and the third voltage terminal V3 and controls to be conductive between the second pull-down node Q2 and the second pull-down generating module 402 in response to a signal of the second pull-up node P2. The second pull-up control module 2012 controls to be conductive between the first pull-down node Q1 and the third voltage terminal V3 and controls to be conductive between the first pull-down node Q1 and the first pull-down generating module 401 in response to a signal of the second pull-up node P2. The second output module 502 controls to be conductive between the second clock signal terminal CK2 and the second output terminal Gout2 in response to a signal of the second pull-up node P2. The first pull-up control module 2011 controls to be conductive between the first pull-down node Q1 and the third voltage terminal V3 and controls to be nonconductive between the first pull-down node Q1 and the first pull-down generating module 401 in response to a signal of the first pull-up node P1. The fourth pull-up control module 2022 controls to be conductive between the second pull-down node Q2 and the third voltage terminal V3 and controls to be nonconductive between the second pull-down node Q2 and the second pull-down generating module 402 in response to a signal of the first pull-up node P1. The first output module 501 controls to be conductive between the first clock signal terminal CK1 and the first output terminal Gout1 in response to a signal of the first pull-up node P1.

Specifically, as shown in conjunction with FIG. 2 and FIG. 3b, in the second stage T2, the thirtieth transistor M30 outputs the high-level signal (i.e. the scanning signal) outputted from the second clock signal terminal CK2 to the second output terminal Gout2 and one polar plate of the second bootstrap capacitor C2, the second output terminal Gout2 scans a gate line connected to the second output terminal Gout2, and the second bootstrap capacitor C2 pulls up a signal of the second pull-up node P2 connected to the other polar plate of the second bootstrap capacitor C2. Since that a signal of the second pull-up node P2 is a high-level signal having a higher level than the scanning signal, the transistor being directly or indirectly conductive with the second pull-up node P2 maintains its state in the first stage T1. In addition, in the second stage T2, the second control terminal RESET1 outputs a high-level signal and controls the second transistor M2 and the fourth transistor M4 to be turned on, so that a signal of the first pull-up node P1 is a high-level signal outputted from the second voltage terminal DIR2, and a signal of the first output terminal Gout1 is the low-level signal outputted from the third voltage terminal V3. The first pull-up node P1 controls the fifth transistor M5 and the sixth transistor M6 to be turned on, and controls the twenty-second transistor M22 and the twenty-third transistor M23 to be turned on, so that each of a signal of the first pull-down node Q1 and a signal of the second pull-down node Q2 is the low-level signal outputted from the third voltage terminal V3, and the first pull-up node P1 keeps controlling to be nonconductive between the first pull-down generating module 401 and the first pull-down node Q1 and to be nonconductive between the second pull-down generating module 402 and the second pull-down node Q2. The first pull-up node P1 also controls the fifteenth transistor M15 to be turned on, to output a low-level signal outputted from the first clock signal terminal CK1 to the first output terminal Gout1.

In the third stage T3, the first output module 501 controls to be conductive between the first clock signal terminal CK1 and the first output terminal Gout1 in response to a signal of the first pull-up node P1, and a signal outputted from the first clock signal terminal CK1 is a scanning signal. The second input module 102 controls to be conductive between the first voltage terminal DIR1 and the second pull-up node P2 and controls to be conductive between the third voltage terminal V3 and the second output terminal Gout2 in response to a signal of the third control terminal SET2. The first pull-up control module 2011 controls to be conductive between the first pull-down node Q1 and the third voltage terminal V3 and controls to be nonconductive between the first pull-down node Q1 and the first pull-down generating module 401 in response to a signal of the first pull-up node P1. The fourth pull-up control module 2022 controls to be conductive between the second pull-down node Q2 and the third voltage terminal V3 and controls to be nonconductive between the second pull-down node Q2 and the second pull-down generating module 402 in response to a signal of the first pull-up node P1.

Specifically, as shown in conjunction with FIG. 2 and FIG. 3b, in the third stage T3, the fifteenth transistor M15 outputs the high-level signal (i.e. the scanning signal) outputted from the first clock signal terminal CK1 to the first output terminal Gout1 and one polar plate of the first bootstrap capacitor C1. The first output terminal Gout1 scans a gate line connected to the first output terminal Gout1, and the first bootstrap capacitor C1 pulls up a signal of the first pull-up node P1 connected to the other polar plate of the first bootstrap capacitor C1. Since that a signal of the first pull-up node P1 is a high-level signal having a higher level than the scanning signal, the transistor being directly or indirectly conductive with the first pull-up node P1 maintains its state in the second stage T2. In addition, in the third stage T3, the third control terminal SET2 outputs a high-level signal and controls the sixteenth transistor M16 and the eighteenth transistor M18 to be turned on, so that a signal of the second pull-up node P2 is a low-level signal outputted from the first voltage terminal DIR1, and a signal of the second output terminal Gout2 is a low-level signal outputted from the third voltage terminal V3. In this case, each of the transistors connected to the second pull-up node P2 is in a turn-off state.

In the fourth stage T4, the first input module 101 controls to be conductive between the first voltage terminal DIR1 and the first pull-up node P1 and controls to be conductive between the third voltage terminal V3 and the first output terminal Gout1 in response to a signal of the first control terminal SET1. The first pull-down generating module 401 controls to be conductive between the first signal terminal Vclock1 and the first pull-down node Q1 in response to a signal of the first signal terminal Vclock1, the first pull-down control module 3011 controls to be conductive between the first pull-up node P1 and the third voltage terminal V3 and controls to be conductive between the third voltage terminal V3 and the first output terminal Gout1 in response to a signal of the first pull-down node Q1, the fourth pull-down control module 3022 controls to be conductive between the second pull-up node P2 and the third voltage terminal V3 and controls to be conductive between the third voltage terminal V3 and the second output terminal Gout2 in response to a signal of the first pull-down node Q1. Alternatively, the second pull-down generating module 402 controls to be conductive between the second signal terminal Vclock2 and the second pull-down node Q2 in response to a signal of the second signal terminal Vclock2, the third pull-down control module 3021 controls to be conductive between the second pull-up node P2 and the third voltage terminal V3 and controls to be conductive between the third voltage terminal V3 and the second output terminal Gout2 in response to a signal of the second pull-down node Q2, the second pull-down control module 3012 controls to be conductive between the first pull-up node P1 and the third voltage terminal V3 and controls to be conductive between the third voltage terminal V3 and the first output terminal Gout1 in response to a signal of the second pull-down node Q2.

Specifically, as shown in conjunction with FIG. 2 and FIG. 3b, in the fourth stage T4, the first control terminal SET1 outputs a high-level signal, and controls the first transistor M1 and the third transistor M3 to be turned on, so that a signal of the first pull-up node P1 is a low-level signal outputted from the first voltage terminal DIR1, and a signal of the first output terminal Gout1 is a low-level signal outputted from the third voltage terminal V3. Since that in the fourth stage T4, each of the transistors connected to the first pull-up node P1 and the second pull-up node P2 is in a turn-off state, the first pull-down generating module 401 can not be prevented from being conductive with the first pull-down node Q1, and the second pull-down generating module 402 can not be prevented from being conductive with the second pull-down node Q2. With reference to FIG. 3b, in an embodiment of the present disclosure, a signal outputted form the first signal terminal Vclock1 is a low-level signal, and a signal outputted from the second signal terminal Vclock2 is a high-level signal, therefore, the twenty-fifth transistor M25 of the second pull-down generating module 402 transmits the high-level signal to a gate of the twenty-fourth transistor M24 in response to the high-level signal outputted from the second signal terminal Vclock2, and the high-level signal outputted from the second signal terminal Vclock2 is outputted to the second pull-down node Q2 after the twenty-fourth transistor M24 is turned on. The second pull-down node Q2 controls the twenty-sixth transistor M26 and the twenty-seventh transistor M27 to be turned on, and controls the thirteenth transistor M13 and the fourteenth transistor M14 to be turned on, so that each of the signal of the second pull-up node P2, the signal of the first pull-up node P1, the signal of the second output terminal Gout2 and the signal of the first output terminal Gout1 is a low-level signal outputted from the third voltage terminal V3.

In addition, in the reverse scanning, the signal of the second signal terminal Vclock2 may also be a low-level signal, and the signal of the first signal terminal Vclock1 may be a high-level signal, which is not limited in the present disclosure.

Figure 4:
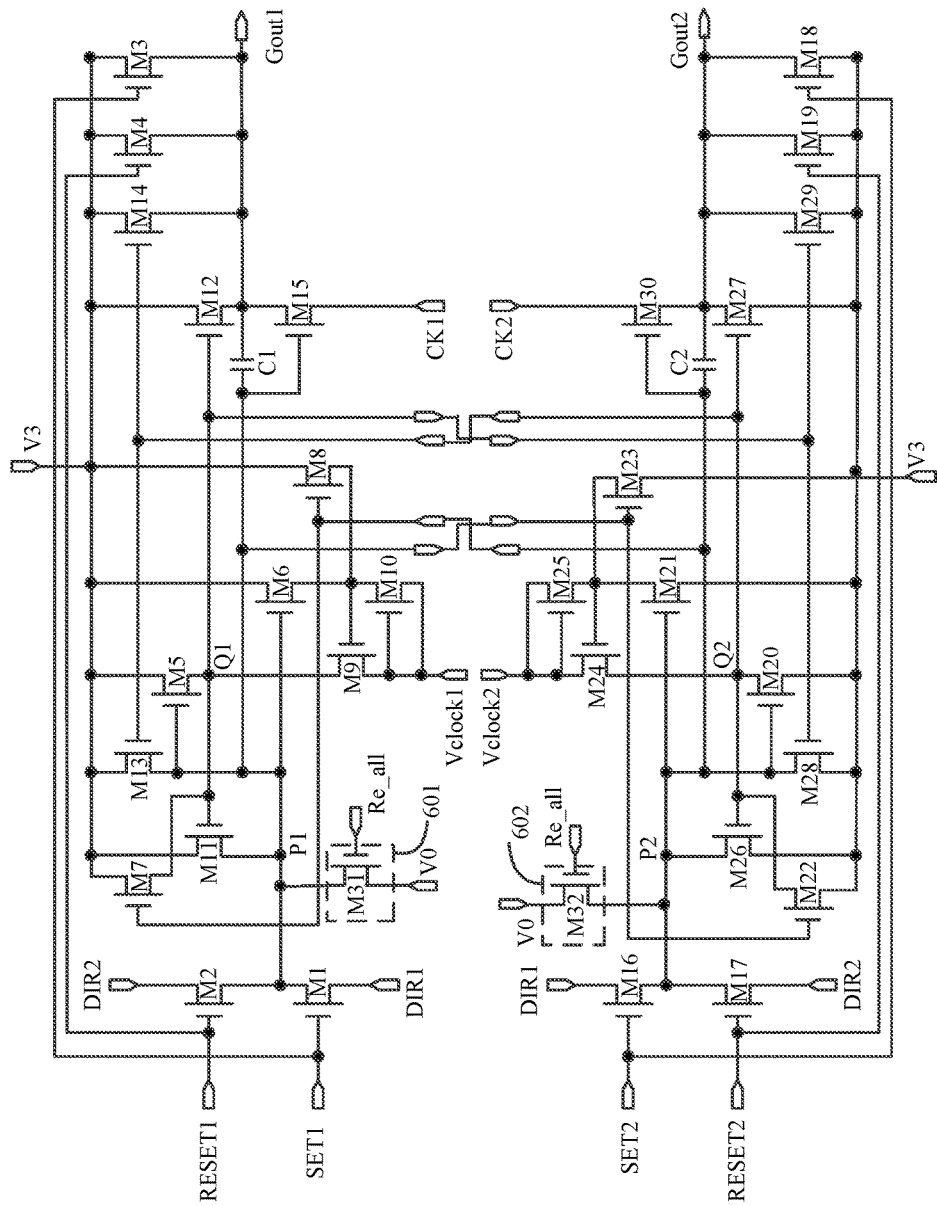
FIG. 4 is a schematic structural diagram of a bidirectional scanning unit according to another embodiment of the present disclosure.

Furthermore, in order to avoid a problem of boost disorder, the bidirectional scanning unit according to the embodiment of the present disclosure further includes a first initialization module and a second initialization module. The first initialization module and the second initialization module are configured to reset signals of the first pull-up node and the second pull-up node in the bidirectional scanning unit before scanning. With reference to FIG. 4, which is a schematic structural diagram of an bidirectional scanning unit according to another embodiment of the present disclosure, the bidirectional scanning unit further includes a first initialization module 601 and a second initialization module 602.

The first initialization module 601 is connected to the first pull-up node P1, and the second initialization module 602 is connected to the second pull-up node P2.

Specifically, the first initialization module 601 is configured to control a conduction state between the first pull-up node P1 and a reset voltage terminal V0 in response to a signal of a reset control terminal Re_all, and the second initialization module 602 is configured to control a conduction state between the second pull-up node P2 and the reset voltage terminal V0 in response to a signal of the reset control terminal Re_all.

Specifically, the first initialization module 601 according to the embodiment of the present disclosure may include a thirty-first transistor M31.

A gate of the thirty-first transistor M31 is connected to the reset control terminal Re_all, a first terminal of the thirty-first transistor M31 is connected to the reset voltage terminal V0, and a second terminal of the thirty-first transistor M31 is connected to the first pull-up node P1.

A composition structure of the first initialization module 601 is identical to a composition structure of the second initialization module 602, that is, the second initialization module 602 includes a thirty-second transistor M32.

A gate of the thirty-second transistor M32 is connected to the reset control terminal Re_all, a first terminal of the thirty-second transistor M32 is connected to the reset voltage terminal V0, and a second terminal of the thirty-second transistor M32 is connected to the second pull-up node P2.

It should be noted that, in a case that the bidirectional scanning unit according to the embodiment of the present disclosure is the bidirectional scanning unit according to the embodiments corresponding to the FIG. 3a and FIG. 3b, each of the thirty-first transistor M31 and the thirty-second transistor M32 may be an N-type transistor. A signal of the reset control terminal Re_all is a high-level signal before the bidirectional scanning unit scans, to turn on the thirty-first transistor M31 and the thirty-second transistor M32, so that a signal outputted from the reset voltage terminal V0 which is a low-level signal is transmitted to the first pull-up node P1 and the second pull-up node P2, to reset the signals of the first pull-up node P1 and the second pull-up node P2, thereby avoiding the problem of boot disorder.

Figure 5:
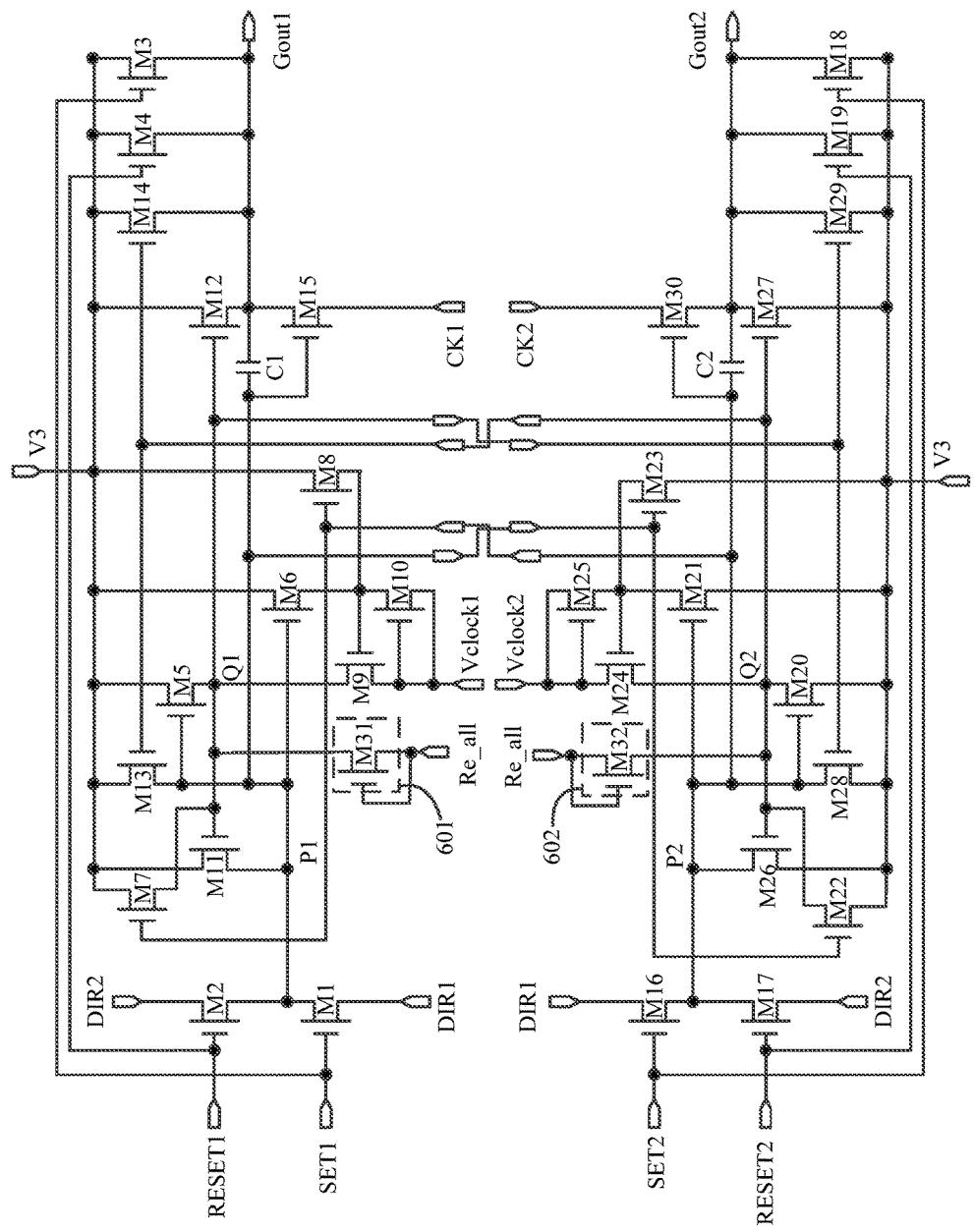
FIG. 5 is a schematic structural diagram of a bidirectional scanning unit according to another embodiment of the present disclosure.

In addition, the first initialization module and the second initialization module according to the embodiment of the present disclosure may also control levels of the pull-down nodes, to indirectly reset the pull-up nodes. With reference to FIG. 5, which is a schematic structural diagram of a bidirectional scanning unit according to another embodiment of the present disclosure, the bidirectional scanning unit includes a first initialization module 601 and a second initialization module 602.

The first initialization module 601 is connected to the first pull-down node Q1, and the second initialization module 602 is connected to the second pull-down node Q2.

Specifically, the first initialization module 601 is configured to control a conduction state between the first pull-down node Q1 and a reset control terminal Re_all in response to a signal of the reset control terminal Re_all, and the second initialization module 602 is configured to control a conduction state between the second pull-down node Q2 and the reset control terminal Re_all in response to a signal of the reset control terminal Re_all.

Specifically, the first initialization module 601 according to the present disclosure includes a thirty-first transistor M31.

Each of a gate and a first terminal of the thirty-first transistor M31 is connected to the reset control terminal, and a second terminal of the thirty-first transistor M31 is connected to the first pull-down node Q1.

Also, the second initialization module 602 includes a thirty-second transistor M32.

Each of a gate and a first terminal of the thirty-second transistor M32 is connected to the reset control terminal, and a second terminal of the thirty-second transistor M32 is connected to the second pull-down node Q2.

It should be noted that in a case that the bidirectional scanning unit according to the embodiment of the present disclosure is the bidirectional scanning unit according to the embodiments corresponding to FIG. 3a and FIG. 3b, each of the thirty-first transistor M31 and the thirty-second transistor M32 may be an N-type transistor. A signal of the reset control terminal Re_all is a high-level signal before the bidirectional scanning unit scans, to turn on the thirty-first transistor M31 and the thirty-second transistor M32, so that a signal outputted from the reset control terminal Re_all which is a high-level signal is transmitted to the first pull-down node Q1 and the second pull-down node Q2. Each of the first pull-up node P1 and the second pull-up node P2 is controlled to be conductive with the third voltage terminal V3 by the pull-down control module connected to the first pull-down node Q1 and the second pull-down node Q2, and the first pull-up node P1 and the second pull-up node P2 are reset by the signal of the third voltage terminal V3, thereby avoiding the problem of boot disorder.

In addition, a gate driving circuit is further provided according to an embodiment of the present disclosure, the gate driving circuit includes n bidirectional scanning units in n stages respectively, the n bidirectional scanning units are a first-stage bidirectional scanning unit to an n-th-stage bidirectional scanning unit. Each of the bidirectional scanning units is the bidirectional scanning unit according to any one of the embodiments described above, where n is an integer no less than 2.

Figure 6:
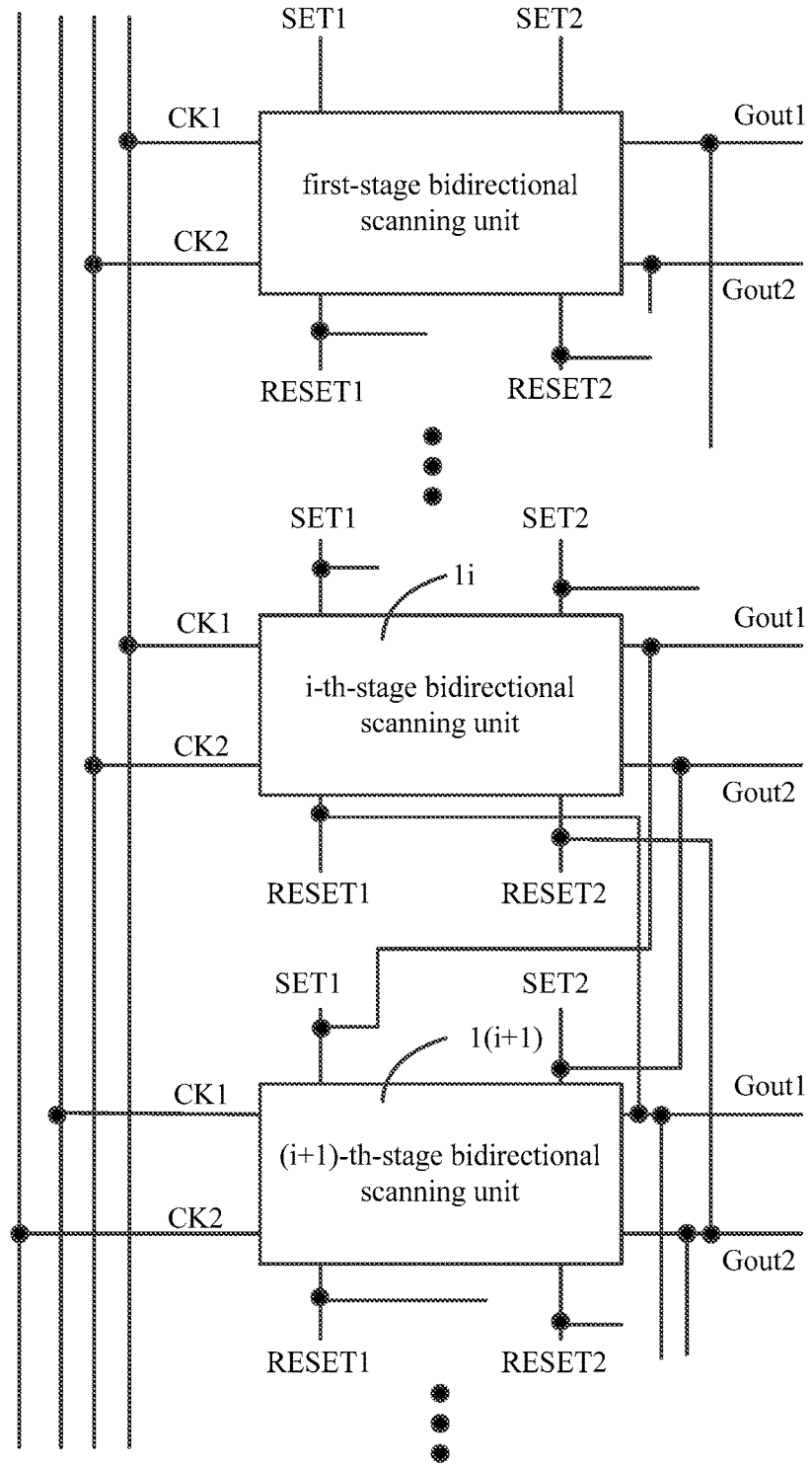
FIG. 6 is a schematic structural diagram of a gate driving circuit according to an embodiment of the present disclosure.

Specifically, with reference to FIG. 6, which is a schematic structural diagram of a gate driving circuit according to an embodiment of the present disclosure, two adjacent bidirectional scanning units are defined as an i-th-stage bidirectional scanning unit 1i and an (i+1)-th-stage bidirectional scanning unit 1(i+1), where i is a positive integer no less than n.

The first output terminal Gout1 of the i-th-stage bidirectional scanning unit 1i is connected to the first control terminal SET1 of the (i+1)-th-stage bidirectional scanning unit 1(i+1), the first output terminal Gout1 of the (i+1)-th-stage bidirectional scanning unit 1(i+1) is connected to the second control terminal RESET1 of the i-th-stage bidirectional scanning unit 1i.

The second output terminal Gout2 of the i-th-stage bidirectional scanning unit 1i is connected to the third control terminal SET2 of the (i+1)-th-stage bidirectional scanning unit 1(i+1), the second output terminal Gout2 of the (i+1)-th-stage bidirectional scanning unit 1(i+1) is connected to the fourth control terminal RESET2 of the i-th-stage bidirectional scanning unit 1i.

Furthermore, the first clock signal terminals CK1 of the bidirectional scanning units in odd stages are a same signal terminal, and the second clock signal terminals CK2 of the bidirectional scanning units in odd stages are a same signal terminal. Also, the first clock signal terminals CK1 of the bidirectional scanning units in even stages are a same signal terminal, and the second clock signal terminals CK2 of the bidirectional scanning units in even stages are a same signal terminal.

It should be noted that in the gate driving circuit according to the embodiment of the present disclosure, in the forward scanning, each of the first control terminal SET1 and the third control terminal SET2 of the first-stage bidirectional scanning unit provides an original control signal by an external signal line. Also, in the reverse scanning, each of the second control terminal RESET1 and the fourth control terminal RESET2 of the n-th-stage bidirectional scanning unit provides an original control signal by an external signal line. In addition, since that all output terminals of the bidirectional scanning units in n stages connected in series output scanning signals stage by stage in the scanning process, in the forward scanning, the second clock signal terminal of the first-stage bidirectional scanning unit outputs a scanning signal after the first clock signal terminal of the first-stage bidirectional scanning unit outputs a scanning signal, similarly, the second clock signal terminal of the second-stage bidirectional scanning unit outputs a scanning signal after the first clock signal terminal of the second-stage bidirectional scanning unit outputs a scanning signal, and the first clock signal terminal of the second-stage bidirectional scanning unit outputs a scanning signal after the second clock signal terminal of the first-stage bidirectional scanning unit outputs a scanning signal. Also, in the reverse scanning, the first clock signal terminal of the n-th-stage bidirectional scanning unit outputs a scanning signal after the second clock signal terminal of the n-th-stage bidirectional scanning unit outputs a scanning signal, similarly, the first clock signal terminal of the (n−1)-th-stage bidirectional scanning unit outputs a scanning signal after the second clock signal terminal of the (n−1)-th-stage bidirectional scanning unit outputs a scanning signal, and the second time clock signal terminal of the (n−1)-th-stage bidirectional scanning unit outputs a scanning signal after the first clock signal terminal of the n-th-stage bidirectional scanning unit outputs a scanning signal.

In addition, in practical application, a phase difference between a signal outputted from the first clock signal terminal and a signal outputted from the second clock signal terminal is 180 degrees, and the signal outputted from the first clock signal terminal and the signal outputted from the second clock signal terminal have same frequency. In the forward scanning, the signal outputted from the second clock signal terminal is later than the signal outputted from the first clock signal terminal for a delay of a preset time period; and in the reverse scanning, the signal outputted from the first clock signal terminal is later than the signal outputted from the second clock signal terminal for a delay of a preset time period. For multiple bidirectional scanning units in multiple stages connected in series: in the forward scanning, the signal outputted from the first clock signal terminal of the bidirectional scanning unit in a latter stage is later than the signal outputted from the second clock signal terminal of the bidirectional scanning unit in a former stage for a delay of a preset time period; and in the reverse scanning, the signal outputted from the second clock signal terminal of the bidirectional scanning unit in a latter stage is later than the signal outputted from the first clock signal terminal of the bidirectional scanning unit in a former stage for a delay of a preset time period. The preset time period is not limited herein.

A bidirectional scanning unit, a driving method and a gate driving circuit are provided according to the present disclosure. The bidirectional scanning unit includes a first-stage sub unit and a second-stage sub unit, the bidirectional scanning unit can output a scanning signal stage by stage in a direction from the first-stage sub unit to the second-stage sub unit, and can also output a scanning signal stage by stage in a direction from the second-stage sub unit to the first-stage sub unit. Since that the first-stage sub unit coordinates with the second-stage sub unit in a scanning process, when one of the first-stage sub unit and the second-stage sub unit outputs the scanning signal, the other of the first-stage sub unit and the second-stage sub unit does not output the scanning signal. In the technical solution according to the present disclosure, the bidirectional scanning unit can output scanning signals for two stages stage by stage, and a structure of the bidirectional scanning unit can be simplified by interaction between the first-stage sub unit and the second-stage sub unit, and the demand for the diversity of the gate driving circuit can be met.

According to the above description of the disclosed embodiments, those skilled in the art can implement or practice the present disclosure. Many changes to these embodiments are apparent for those skilled in the art, and general principles defined herein may be implemented in other embodiments without departing from the spirit or scope of the present disclosure. Hence, the present disclosure is not limited to the embodiments disclosed herein, but is to conform to the widest scope in accordance with the principles and novel features disclosed herein.

The invention claimed is:

1. A bidirectional scanning unit, comprising:
a first-stage sub unit comprising
a first input module,
a first pull-up node,
a first pull-up control module,
a second pull-up control module,
a first pull-down node,
a first pull-down control module,
a second pull-down control module,
a first pull-down generating module,
a first output module, and
a first output terminal; and
a second-stage sub unit comprising
a second input module,
a second pull-up node,
a third pull-up control module,
a fourth pull-up control module,
a second pull-down node,
a third pull-down control module,
a fourth pull-down control module,
a second pull-down generating module,
a second output module, and
a second output terminal; and, wherein
the first input module is configured to control a conduction state between a first voltage terminal and the first pull-up node and control a conduction state between a third voltage terminal and the first output terminal in response to a signal of a first control terminal, and to control a conduction state between a second voltage terminal and the first pull-up node and control a conduction state between the third voltage terminal and the first output terminal in response to a signal of a second control terminal, wherein a level of a signal outputted from the first voltage terminal is opposite to a level of a signal outputted from the second voltage terminal;
the second input module is configured to control a conduction state between the first voltage terminal and the second pull-up node and control a conduction state between the third voltage terminal and the second output terminal in response to a signal of a third control terminal, and to control a conduction state between the second voltage terminal and the second pull-up node and control a conduction state between the third voltage terminal and the second output terminal in response to a signal of a fourth control terminal, wherein a structure of the first input module is identical to a structure of the second input module;
the first pull-up control module is configured to control a conduction state between the first pull-down node and the third voltage terminal and control a conduction state between the first pull-down node and the first pull-down generating module in response to a signal of the first pull-up node, the second pull-up control module is configured to control a conduction state between the first pull-down node and the third voltage terminal and control a conduction state between the first pull-down node and the first pull-down generating module in response to a signal of the second pull-up node;

the third pull-up control module is configured to control a conduction state between the second pull-down node and the third voltage terminal and control a conduction state between the second pull-down node and the second pull-down generating module in response to a signal of the second pull-up node, the fourth pull-up control module is configured to control a conduction state between the second pull-down node and the third voltage terminal and control a conduction state between the second pull-down node and the second pull-down generating module in response to a signal of the first pull-up node, wherein a structure of the first pull-up control module is identical to a structure of the third pull-up control module, and a structure of the second pull-up control module is identical to a structure of the fourth pull-up control module;

the first pull-down generating module is configured to control a conduction state between a first signal terminal and the first pull-down node in response a signal of the first signal terminal;

the second pull-down generating module is configured to control a conduction state between a second signal terminal and the second pull-down node in response to a signal of the second signal terminal, wherein a structure of the first pull-down generating module is identical to a structure of the second pull-down generating module;

the first pull-down control module is configured to control a conduction state between the first pull-up node and the third voltage terminal and control a conduction state between the third voltage terminal and the first output terminal in response to a signal of the first pull-down node, the second pull-down control module is configured to control a conduction state between the first pull-up node and the third voltage terminal and control a conduction state between the third voltage terminal and the first output terminal in response to a signal of the second pull-down node;

the third pull-down control module is configured to control a conduction state between the second pull-up node and the third voltage terminal and control a conduction state between the third voltage terminal and the second output terminal in response to a signal of the second pull-down node, the fourth pull-down control module is configured to control a conduction state between the second pull-up node and the third voltage terminal and control a conduction state between the third voltage terminal and the second output terminal in response to a signal of the first pull-down node, wherein a structure of the first pull-down control module is identical to a structure of the third pull-down control module, and a structure of the second pull-down control module is identical to a structure of the fourth pull-down control module; and the first output module is configured to control a conduction state between a first clock signal terminal and the first output terminal in response to a signal of the first pull-up node, and the second output module is configured to control a conduction state between a second clock signal terminal and the second output terminal in response to a signal of the second pull-up node, wherein a phase difference between a signal outputted from the first clock signal terminal and a signal outputted from the second clock signal terminal is 180 degrees, and a structure of the first output module is identical to a structure of the second output module.

2. The bidirectional scanning unit according to claim 1, wherein the first input module comprises: a first transistor, a second transistor, a third transistor and a fourth transistor, wherein a gate of the first transistor is connected to the first control terminal, a first terminal of the first transistor is connected to the first voltage terminal, and a second terminal of the first transistor is connected to the first pull-up node; a gate of the second transistor is connected to the second control terminal, a first terminal of the second transistor is connected to the second voltage terminal, and a second terminal of the second transistor is connected to the first pull-up node; a gate of the third transistor is connected to the first control terminal, a first terminal of the third transistor is connected to the third voltage terminal, and a second terminal of the third transistor is connected to the first output terminal; a gate of the fourth transistor is connected to the second control terminal, a first terminal of the fourth transistor is connected to the third voltage terminal, and a second terminal of the fourth transistor is connected to the first output terminal; and the second input module comprises a sixteenth transistor, a seventeenth transistor, an eighteenth transistor and a nineteenth transistor; wherein a gate of the sixteenth transistor is connected to the third control terminal, a first terminal of the sixteenth transistor is connected to the first voltage terminal, and a second terminal of the sixteenth transistor is connected to the second pull-up node; a gate of the seventeenth transistor is connected to the fourth control terminal, a first terminal of the seventeenth transistor is connected to the second voltage terminal, and a second terminal of the seventeenth transistor is connected to the second pull-up node; a gate of the eighteenth transistor is connected to the third control terminal, a first terminal of the eighteenth transistor is connected to the third voltage terminal, and a second terminal of the eighteenth transistor is connected to the second output terminal; a gate of the nineteenth transistor is connected to the fourth control terminal, a first terminal of the nineteenth transistor is connected to the third voltage terminal, and a second terminal of the nineteenth transistor is connected to the second output terminal.

3. The bidirectional scanning unit according to claim 1, wherein the first pull-up control module comprises a fifth transistor and a sixth transistor, wherein a gate of the fifth transistor is connected to the first pull-up node, a first terminal of the fifth transistor is connected to the third voltage terminal, and a second terminal of the fifth transistor is connected to the first pull-down node; a gate of the sixth transistor is connected to the first pull-up node, a first terminal of the sixth transistor is connected to the third voltage terminal, and a second terminal of the sixth transistor is connected to the first pull-down generating module; and the third pull-up control module comprises a twentieth transistor and a twenty-first transistor, wherein a gate of the twentieth transistor is connected to the second pull-up node, a first terminal of the twentieth transistor is connected to the third voltage terminal, and a second terminal of the twentieth transistor is connected to the second pull-down node; a gate of the twenty-first transistor is connected to the second pull-up node, a first terminal of the twenty-first transistor is connected to the third voltage terminal, and a second terminal of the twenty-first transistor is connected to the second pull-down generating module.

4. The bidirectional scanning unit according to claim 3, wherein the second pull-up control module comprises a seventh transistor and an eighth transistor, wherein a gate of the seventh transistor is connected to the second pull-up node, a first terminal of the seventh transistor is connected to the third voltage terminal, and a second terminal of the seventh transistor is connected to the first pull-down node; a gate of the eighth transistor is connected to the second pull-up node, a first terminal of the eighth transistor is connected to the third voltage terminal, and a second terminal of the eighth transistor is connected to the first pull-down generating module; and the fourth pull-up control module comprises a twenty-second transistor and a twenty-third transistor, wherein a gate of the twenty-second transistor is connected to the first pull-up node, a first terminal of the twenty-second transistor is connected to the third voltage terminal, and a second terminal of the twenty-second transistor is connected to the second pull-down node; a gate of the twenty-third transistor is connected to the first pull-up node, a first terminal of the twenty-third transistor is connected to the third voltage terminal, and a second terminal of the twenty-third transistor is connected to the second pull-down generating module.

5. The bidirectional scanning unit according to claim 4, wherein the first pull-down generating module comprises a ninth transistor and a tenth transistor, wherein a gate of the ninth transistor is connected to the second terminals of the sixth transistor and the eighth transistor, a first terminal of the ninth transistor is connected to the first signal terminal, and a second terminal of the ninth transistor is connected to the first pull-down node; each of a gate and a first terminal of the tenth transistor is connected to the first signal terminal, and a second terminal of the tenth transistor is connected to the second terminals of the sixth transistor and the eighth transistor; and the second pull-down generating module comprises a twenty-fourth transistor and a twenty-fifth transistor, wherein a gate of the twenty-fourth transistor is connected to the second terminals of the twenty-first transistor and the twenty-third transistor, a first terminal of the twenty-fourth transistor is connected to the second signal terminal, and a second terminal of the twenty-fourth transistor is connected to the second pull-down node; each of a gate and a first terminal of the twenty-fifth transistor is connected to the second signal terminal, and a second terminal of the twenty-fifth transistor is connected to the second terminals of the twenty-first transistor and the twenty-third transistor.

6. The bidirectional scanning unit according to claim 5, wherein each of width to length ratios of the sixth transistor and the eighth transistor is greater than a width to length ratio of the tenth transistor, and each of width to length ratios of the twenty-first transistor and the twenty-third transistor is greater than a width to length ratio of the twenty-fifth transistor.

7. The bidirectional scanning unit according to claim 1, wherein the first pull-down control module comprises an eleventh transistor and a twelfth transistor, wherein a gate of the eleventh transistor is connected to the first pull-down node, a first terminal of the eleventh transistor is connected to the third voltage terminal, and a second terminal of the eleventh transistor is connected to the first pull-up node; a gate of the twelfth transistor is connected to the first pull-down node, a first terminal of the twelfth transistor is connected to the third voltage terminal, and a second terminal of the twelfth transistor is connected to the first output terminal; and the third pull-down control module comprises a twenty-sixth transistor and a twenty-seventh transistor, wherein a gate of the twenty-sixth transistor is connected to the second pull-down node, a first terminal of the twenty-sixth transistor is connected to the third voltage terminal, and a second terminal of the twenty-sixth transistor is connected to the second pull-up node; a gate of the twenty-seventh transistor is connected to the second pull-down node, a first terminal of the twenty-seventh transistor is connected to the third voltage terminal, and a second terminal of the twenty-seventh transistor is connected to the second output terminal.

8. The bidirectional scanning unit according to claim 7, wherein the second pull-down control module comprises a thirteenth transistor and a fourteenth transistor, wherein a gate of the thirteenth transistor is connected to the second pull-down node, a first terminal of the thirteenth transistor is connected to the third voltage terminal, and a second terminal of the thirteenth transistor is connected to the first pull-up node; a gate of the fourteenth transistor is connected to the second pull-down node, a first terminal of the fourteenth transistor is connected to the third voltage terminal, and a second terminal of the fourteenth transistor is connected to the first output terminal; and the fourth pull-down control module comprises a twenty-eighth transistor and a twenty-ninth transistor, wherein a gate of the twenty-eighth transistor is connected to the first pull-down node, a first terminal of the twenty-eighth transistor is connected to the third voltage terminal, and a second terminal of the twenty-eighth transistor is connected to the second pull-up node; a gate of the twenty-ninth transistor is connected to the first pull-down node, a first terminal of the twenty-ninth transistor is connected to the third voltage terminal, and a second terminal of the twenty-ninth transistor is connected to the second output terminal.

9. The bidirectional scanning unit according to claim 1, wherein the first output module comprises a fifteenth transistor and a first bootstrap capacitor, wherein each of a gate of the fifteenth transistor and a first polar plate of the first bootstrap capacitor is connected to the first pull-up node, a first terminal of the fifteenth transistor is connected to the first clock signal terminal, and a second terminal of the fifteen transistor and a second polar plate of the first bootstrap capacitor are connected together as the first output terminal; and the second output module comprises a thirtieth transistor and a second bootstrap capacitor, wherein each of a gate of the thirtieth transistor and a first polar plate of the second bootstrap capacitor is connected to the second pull-up node, a first terminal of the thirtieth transistor is connected to the second clock signal terminal, and a second terminal of the thirtieth transistor and a second polar plate of the second bootstrap capacitor are connected together as the second output terminal.

10. The bidirectional scanning unit according to claim 1, wherein a level of a signal outputted from the first signal terminal is opposite to a level of a signal outputted form the second signal terminal, each of the signal outputted from the first signal terminal and the signal outputted from the second signal terminal is a signal inverted once a frame.

11. The bidirectional scanning unit according to claim 1, further comprising: a first initialization module connected to the first pull-up node and a second initialization module connected to the second pull-up node; wherein
the first initialization module is configured to control a conduction state between the first pull-up node and a reset voltage terminal in response to a signal of a reset control terminal, and the second initialization module is configured to control a conduction state between the second pull-up node and the reset voltage terminal in response to a signal of the reset control terminal.

12. The bidirectional scanning unit according to claim 11, wherein the first initialization module comprises a thirty-first transistor,
a gate of the thirty-first transistor is connected to the reset control terminal, a first terminal of the thirty-first transistor is connected to the reset voltage terminal, and a second terminal of the thirty-first transistor is connected to the first pull-up node; and
the second initialization module comprises a thirty-second transistor,
a gate of the thirty-second transistor is connected to the reset control terminal, a first terminal of the thirty-second transistor is connected to the reset voltage terminal, and a second terminal of the thirty-second transistor is connected to the second pull-up node.

13. The bidirectional scanning unit according to claim 1, further comprising: a first initialization module connected to the first pull-down node and a second initialization module connected to the second pull-down node, wherein
the first initialization module is configured to control a conduction state between the first pull-down node and a reset control terminal in response to a signal of the reset control terminal, and the second initialization module is configured to control a conduction state between the second pull-down node and the reset control terminal in response to a signal of the reset control terminal.

14. The bidirectional scanning unit according to claim 13, wherein the first initialization module comprises a thirty-first transistor,
each of a gate and a first terminal of the thirty-first transistor is connected to the reset control terminal, and a second terminal of the thirty-first transistor is connected to the first pull-down node; and
the second initialization module comprises a thirty-second transistor,
each of a gate and a first terminal of the thirty-second transistor is connected to the reset control terminal, and a second terminal of the thirty-second transistor is connected to the second pull-down node.

15. A driving method applied into a bidirectional scanning unit, wherein
the bidirectional scanning unit comprises a first-stage sub unit and a second-stage sub unit, wherein
the first-stage sub unit comprises: a first input module, a first pull-up node, a first pull-up control module, a second pull-up control module, a first pull-down node, a first pull-down control module, a second pull-down control module, a first pull-down generating module, a first output module and a first output terminal; and
the second-stage sub unit comprises: a second input module, a second pull-up node, a third pull-up control module, a fourth pull-up control module, a second pull-down node, a third pull-down control module, a fourth pull-down control module, a second pull-down generating module, a second output module and a second output terminal;
the first input module is configured to control a conduction state between a first voltage terminal and the first pull-up node and control a conduction state between a third voltage terminal and the first output terminal in response to a signal of a first control terminal, and to control a conduction state between a second voltage terminal and the first pull-up node and control a conduction state between the third voltage terminal and the first output terminal in response to a signal of a second control terminal, wherein a level of a signal outputted from the first voltage terminal is opposite to a level of a signal outputted from the second voltage terminal;
the second input module is configured to control a conduction state between the first voltage terminal and the second pull-up node and control a conduction state between the third voltage terminal and the second output terminal in response to a signal of a third control terminal, and to control a conduction state between the second voltage terminal and the second pull-up node and control a conduction state between the third voltage terminal and the second output terminal in response to a signal of a fourth control terminal, wherein a structure of the first input module is identical to a structure of the second input module;
the first pull-up control module is configured to control a conduction state between the first pull-down node and the third voltage terminal and control a conduction state between the first pull-down node and the first pull-down generating module in response to a signal of the first pull-up node, the second pull-up control module is configured to control a conduction state between the first pull-down node and the third voltage terminal and control a conduction state between the first pull-down node and the first pull-down generating module in response to a signal of the second pull-up node;
the third pull-up control module is configured to control a conduction state between the second pull-down node and the third voltage terminal and control a conduction state between the second pull-down node and the second pull-down generating module in response to a signal of the second pull-up node, the fourth pull-up control module is configured to control a conduction state between the second pull-down node and the third voltage terminal and control a conduction state between the second pull-down node and the second pull-down generating module in response to a signal of the first pull-up node, wherein a structure of the first pull-up control module is identical to a structure of the third pull-up control module, and a structure of the second pull-up control module is identical to a structure of the fourth pull-up control module;
the first pull-down generating module is configured to control a conduction state between a first signal terminal and the first pull-down node in response a signal of the first signal terminal;

the second pull-down generating module is configured to control a conduction state between a second signal terminal and the second pull-down node in response to a signal of the second signal terminal, wherein a structure of the first pull-down generating module is identical to a structure of the second pull-down generating module;

the first pull-down control module is configured to control a conduction state between the first pull-up node and the third voltage terminal and control a conduction state between the third voltage terminal and the first output terminal in response to a signal of the first pull-down node, the second pull-down control module is configured to control a conduction state between the first pull-up node and the third voltage terminal and control a conduction state between the third voltage terminal and the first output terminal in response to a signal of the second pull-down node;

the third pull-down control module is configured to control a conduction state between the second pull-up node and the third voltage terminal and control a conduction state between the third voltage terminal and the second output terminal in response to a signal of the second pull-down node, the fourth pull-down control module is configured to control a conduction state between the second pull-up node and the third voltage terminal and control a conduction state between the third voltage terminal and the second output terminal in response to a signal of the first pull-down node, wherein a structure of the first pull-down control module is identical to a structure of the third pull-down control module, and a structure of the second pull-down control module is identical to a structure of the fourth pull-down control module; and the first output module is configured to control a conduction state between a first clock signal terminal and the first output terminal in response to a signal of the first pull-up node, and the second output module is configured to control a conduction state between a second clock signal terminal and the second output terminal in response to a signal of the second pull-up node, wherein a phase difference between a signal outputted from the first clock signal terminal and a signal outputted from the second clock signal terminal is 180 degrees, and a structure of the first output module is identical to a structure of the second output module;

the driving method comprises a first stage, a second stage, a third stage and a fourth stage, wherein in a case of scanning in a direction from the first-stage sub unit to the second-stage sub unit, in the first stage, the first input module controls to be conductive between the first voltage terminal and the first pull-up node and controls to be conductive between the third voltage terminal and the first output terminal in response to a signal of the first control terminal, wherein the first pull-up control module controls to be nonconductive between the first pull-down node and the third voltage terminal and controls to be nonconductive between the first pull-down node and the first pull-down generating module in response to a signal of the first pull-up node, the fourth pull-up control module controls to be conductive between the second pull-down node and the third voltage terminal and controls to be nonconductive between the second pull-down node and the second pull-down generating module in response to a signal of the first pull-up node, and the first output module controls to be conductive between the first clock signal terminal and the first output terminal in response to a signal of the first pull-up node;

in the second stage, the first output module controls to be conductive between the first clock signal terminal and the first output terminal in response to a signal of the first pull-up node, and a signal outputted from the first clock signal terminal is a scanning signal, the second input module controls to be conductive between the first voltage terminal and the second pull-up node and controls to be conductive between the third voltage terminal and the second output terminal in response to a signal of the third control terminal, wherein the first pull-up control module controls to be conductive between the first pull-down node and the third voltage terminal and controls to be nonconductive between the first pull-down node and the first pull-down generating module in response to a signal of the first pull-up node, the second pull-up control module controls to be conductive between the first pull-down node and the third voltage terminal and controls to be nonconductive between the first pull-down node and the first pull-down generating module in response to a signal of the second pull-up node, the third pull-up control module controls to be conductive between the second pull-down node and the third voltage terminal and controls to be nonconductive between the second pull-down node and the second pull-down generating module in response to a signal of the second pull-up node, the fourth pull-up control module controls to be conductive between the second pull-down node and the third voltage terminal and controls to be nonconductive between the second pull-down node and the second pull-down generating module in response to a signal of the first pull-up node, and the second output module controls to be conductive between the second clock signal terminal and the second output terminal in response to a signal of the second pull-up node;

in the third stage, the second output module controls to be conductive between the second clock signal terminal and the second output terminal in response to a signal of the second pull-up node, and a signal outputted from the second clock signal terminal is a scanning signal, the first input module controls to be conductive between the second voltage terminal and the first pull-up node and controls to be conductive between the third voltage terminal and the first output terminal in response to a signal of the second control terminal, wherein the third pull-up control module controls to be conductive between the second pull-down node and the third voltage terminal and controls to be nonconductive between the second pull-down node and the second pull-down generating module in response to a signal of the second pull-up node, and the second pull-up control module controls to be conductive between the first pull-down node and the third voltage terminal and controls to be nonconductive between the first pull-down node and the first pull-down generating module in response to a signal of the second pull-up node; and in the fourth stage, the second input module controls to be conductive between the second voltage terminal and the second pull-up node and controls to be conductive between the third voltage terminal and the second output terminal in response to a signal of the fourth control terminal, wherein the first pull-down generating module controls to be conductive between the first signal terminal and the first pull-down node in response to a signal of the first signal terminal, the first pull-down control module controls to be conductive between the first pull-up node and the third voltage terminal and controls to be conductive between the third voltage terminal and the first output terminal in response to a signal of the first pull-down node, the fourth pull-down control module controls to be conductive between the second pull-up node and the third voltage terminal and controls to be conductive between the third voltage terminal and the second output terminal in response to a signal of the first pull-down node; alternatively, the second pull-down generating module controls to be conductive between the second signal terminal and the second pull-down node in response to a signal of the second signal terminal, the third pull-down control module controls to be conductive between the second pull-up node and the third voltage terminal and controls to be conductive between the third voltage terminal and the second output terminal in response to a signal of the second pull-down node, and the second pull-down control module controls to be conductive between the first pull-up node and the third voltage terminal and controls to be conductive between the third voltage terminal and the first output terminal in response to a signal of the second pull-down node; and wherein in a case of scanning in a direction from the second-stage sub unit to the first-stage sub unit, in the first stage, the second input module controls to be conductive between the second voltage terminal and the second pull-up node and control to be conductive between the third voltage terminal and the second output terminal in response to a signal of the fourth control terminal, wherein the third pull-up control module controls to be conductive between the second pull-down node and the third voltage terminal and controls to be conductive between the second pull-down node and the second pull-down generating module in response to a signal of the second pull-up node, the second pull-up control module controls to be conductive between the first pull-down node and the third voltage terminal and controls to be conductive between the first pull-down node and the first pull-down generating module in response to a signal of the second pull-up node, and the second output module controls to be conductive between the second clock signal terminal and the second output terminal in response to a signal of the second pull-up node;

in the second stage, the second output module controls to be conductive between the second clock signal terminal and the second output terminal in response to a signal of the second pull-up node, and a signal outputted from the second clock signal terminal is the scanning signal, the first input module controls to be conductive between the second voltage terminal and the first pull-up node and controls to be conductive between the third voltage terminal and the first output terminal in response to a signal of the second control terminal, wherein the third pull-up control module controls to be conductive between the second pull-down node and the third voltage terminal and controls to be conductive between the second pull-down node and the second pull-down generating module in response to a signal of the second pull-up node, the second pull-up control module controls to be conductive between the first pull-down node and the third voltage terminal and controls to be conductive between the first pull-down node and the first pull-down generating module in response to a signal of the second pull-up node, the second output module controls to be conductive between the second clock signal terminal and the second output terminal in response to a signal of the second pull-up node, the first pull-up control module controls to be conductive between the first pull-down node and the third voltage terminal and controls to be nonconductive between the first pull-down node and the first pull-down generating module in response to a signal of the first pull-up node, the fourth pull-up control module controls to be conductive between the second pull-down node and the third voltage terminal and controls to be nonconductive between the second pull-down node and the second pull-down generating module in response to a signal of the first pull-up node, and the first output module controls to be conductive between the first clock signal terminal and the first output terminal in response to a signal of the first pull-up node;

in the third stage, the first output module controls to be conductive between the first clock signal terminal and the first output terminal in response to a signal of the first pull-up node, and a signal outputted from the first clock signal terminal is a scanning signal, the second input module controls to be conductive between the first voltage terminal and the second pull-up node and controls to be conductive between the third voltage terminal and the second output terminal in response to a signal of the third control terminal, wherein the first pull-up control module controls to be conductive between the first pull-down node and the third voltage terminal and controls to be nonconductive between the first pull-down node and the first pull-down generating module in response to a signal of the first pull-up node, and the fourth pull-up control module controls to be conductive between the second pull-down node and the third voltage terminal and controls to be nonconductive between the second pull-down node and the second pull-down generating module in response to a signal of the first pull-up node; and in the fourth stage, the first input module controls to be conductive between the first voltage terminal and the first pull-up node and controls to be conductive between the third voltage terminal and the first output terminal in response to a signal of the first control terminal, wherein the first pull-down generating module controls to be conductive between the first signal terminal and the first pull-down node in response to a signal of the first signal terminal, the first pull-down control module controls to be conductive between the first pull-up node and the third voltage terminal and controls to be conductive between the third voltage terminal and the first output terminal in response to a signal of the first pull-down node, and the fourth pull-down control module controls to be conductive between the second pull-up node and the third voltage terminal and controls to be conductive between the third voltage terminal and the second output terminal in response to a signal of the first pull-down node; alternatively, the second pull-down generating module controls to be conductive between the second signal terminal and the second pull-down node in response to a signal of the second signal terminal, the third pull-down control module controls to be conductive between the second pull-up node and the third voltage terminal and controls to be conductive between the third voltage terminal and the second output terminal in response to a signal of the second pull-down node, and the second pull-down control module controls to be conductive between the first pull-up node and the third voltage terminal and controls to be conductive between the third voltage terminal and the first output terminal in response to a signal of the second pull-down node.

16. The driving method according to claim 15, wherein the bidirectional scanning unit further comprises: a first initialization module connected to the first pull-up node and a second initialization module connected to the second pull-up node; wherein
the first initialization module is configured to control a conduction state between the first pull-up node and a reset voltage terminal in response to a signal of a reset control terminal, and the second initialization module is configured to control a conduction state between the second pull-up node and the reset voltage terminal in response to a signal of the reset control terminal.

17. The driving method according to claim 15, wherein the bidirectional scanning unit further comprises: a first initialization module connected to the first pull-down node and a second initialization module connected to the second pull-down node, wherein
the first initialization module is configured to control a conduction state between the first pull-down node and a reset control terminal in response to a signal of the reset control terminal, and the second initialization module is configured to control a conduction state between the second pull-down node and the reset control terminal in response to a signal of the reset control terminal.

18. A gate driving circuit, comprising n bidirectional scanning units in n stages respectively, wherein the n bidirectional scanning units are a first-stage bidirectional scanning unit to an n-th-stage bidirectional scanning unit, each of the bidirectional scanning units is the bidirectional scanning unit according to claim 1, and n is an integer no less than 2.

19. The gate driving circuit according to claim 18, wherein two adjacent bidirectional scanning units are defined as an i-th-stage bidirectional scanning unit and an (i+1)-th-stage bidirectional scanning unit, wherein i is a positive integer no less than n;
the first output terminal of the i-th-stage bidirectional scanning unit is connected to the first control terminal of the (i+1)-th-stage bidirectional scanning unit, the first output terminal of the (i+1)-th-stage bidirectional scanning unit is connected to the second control terminal of the i-th-stage bidirectional scanning unit;
the second output terminal of the i-th-stage bidirectional scanning unit is connected to the third control terminal of the (i+1)-th-stage bidirectional scanning unit, the second output terminal of the (i+1)-th-stage bidirectional scanning unit is connected to the fourth control terminal of the i-th-stage bidirectional scanning unit; and
the first clock signal terminals of the bidirectional scanning units in odd stages are a same signal terminal, and the second clock signal terminals of the bidirectional scanning units in odd stages are a same signal terminal, the first clock signal terminals of the bidirectional scanning units in even stages are a same signal terminal, and the second clock signal terminals of the bidirectional scanning units in even stages are a same signal terminal.

20. The gate driving circuit according to claim 18, wherein the bidirectional scanning unit further comprises: a first initialization module connected to the first pull-up node and a second initialization module connected to the second pull-up node; wherein
the first initialization module is configured to control a conduction state between the first pull-up node and a reset voltage terminal in response to a signal of a reset control terminal, and the second initialization module is configured to control a conduction state between the second pull-up node and the reset voltage terminal in response to a signal of the reset control terminal.

* * * * *